US012230192B2

(12) United States Patent
Lee et al.

(10) Patent No.: US 12,230,192 B2
(45) Date of Patent: Feb. 18, 2025

(54) DISPLAY APPARATUS AND METHOD OF MANUFACTURING THE SAME

(71) Applicant: Samsung Display Co., LTD., Yongin-si (KR)

(72) Inventors: Jeongseok Lee, Yongin-si (KR); Wooyong Sung, Yongin-si (KR); Taewook Kang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/240,624

(22) Filed: Aug. 31, 2023

(65) Prior Publication Data

US 2024/0096267 A1    Mar. 21, 2024

(30) Foreign Application Priority Data

Sep. 15, 2022    (KR) .......................... 10-2022-0116638

(51) Int. Cl.
 *G09G 3/32*    (2016.01)
 *G09G 3/20*    (2006.01)

(52) U.S. Cl.
 CPC ............. *G09G 3/32* (2013.01); *G09G 3/2074* (2013.01); *G09G 2300/02* (2013.01); *G09G 2300/0413* (2013.01); *G09G 2300/0426* (2013.01); *G09G 2300/0456* (2013.01); *G09G 2330/04* (2013.01)

(58) Field of Classification Search
 CPC .... G09G 3/32; G09G 3/2074; G09G 2300/02; G09G 2300/0413; G09G 2300/0426; G09G 2300/0456; G09G 2330/04; H10K 59/35; H10K 59/88; H10K 71/233; H10K 59/1201; H10K 59/122; H10K 50/865; H10K 50/82; H10K 59/124; H10K 71/00; H10K 71/10; H10K 71/231
 See application file for complete search history.

(56) References Cited

U.S. PATENT DOCUMENTS

| 9,236,581 | B2 | 1/2016 | Kato |
| 9,614,168 | B2 | 4/2017 | Zhang et al. |
| 10,304,919 | B2 | 5/2019 | Jinbo et al. |
| 2007/0263164 | A1 | 11/2007 | Kumagai |

(Continued)

FOREIGN PATENT DOCUMENTS

| EP | 3629378 A1 | 4/2020 |
| KR | 100846599 B1 | 7/2008 |
| KR | 1020150141338 A | 12/2015 |

*Primary Examiner* — Abhishek Sarma
(74) *Attorney, Agent, or Firm* — CANTOR COLBURN LLP

(57) ABSTRACT

A display apparatus includes a first sub-pixel electrode, a metal bank layer in which a first opening overlapping the first sub-pixel electrode is defined, the metal bank layer including a first metal layer and a second metal layer on the first metal layer, an insulating layer between an outer portion of the first sub-pixel electrode and the metal bank layer, a first intermediate layer overlapping the first sub-pixel electrode through the first opening of the metal bank layer, a first opposite electrode disposed on the first intermediate layer through the first opening of the metal bank layer, and a low-reflective layer disposed on the second metal layer of the metal bank layer and having a reflectivity less than a reflectivity of the second metal layer.

17 Claims, 27 Drawing Sheets

(56) References Cited

U.S. PATENT DOCUMENTS

| | | | |
|---|---|---|---|
| 2012/0025224 A1* | 2/2012 | Yuasa | H10K 59/122 |
| | | | 257/89 |
| 2017/0244069 A1* | 8/2017 | Kim | H10K 50/865 |
| 2017/0309693 A1 | 10/2017 | Pang | |
| 2022/0077251 A1 | 3/2022 | Choung et al. | |

* cited by examiner

DISPLAY APPARATUS AND METHOD OF MANUFACTURING THE SAME

This application claims priority to Korean Patent Application No. 10-2022-0116638, filed on Sep. 15, 2022, and all the benefits accruing therefrom under 35 U.S.C. § 119, the content of which in its entirety is herein incorporated by reference.

BACKGROUND

1. Field

Embodiments relate to a display apparatus and a method of manufacturing the display apparatus.

2. Description of the Related Art

A display apparatus visually displays data. A display apparatus may display images by light-emitting diodes. The usage of display apparatuses has diversified. Accordingly, various designs to improve the quality of display apparatuses have been attempted.

SUMMARY

Embodiments relate to a display apparatus and a method of manufacturing the display apparatus.

Additional features will be set forth in part in the description which follows and, in part, will be apparent from the description, or may be learned by practice of the presented embodiments of the disclosure.

In an embodiment of the disclosure, a display apparatus includes a first sub-pixel electrode, a metal bank layer in which a first opening overlapping the first sub-pixel electrode is defined, the metal bank layer including a first metal layer and a second metal layer on the first metal layer, an insulating layer between an outer portion of the first sub-pixel electrode and the metal bank layer, a first intermediate layer overlapping the first sub-pixel electrode through the first opening of the metal bank layer, a first opposite electrode disposed on the first intermediate layer through the first opening of the metal bank layer, and a low-reflective layer disposed on the second metal layer of the metal bank layer and having a reflectivity less than a reflectivity of the second metal layer.

In an embodiment, the low-reflective layer may include a metal oxide.

In an embodiment, the low-reflective layer may include at least one of copper oxide (CuO), calcium oxide (CaO), molybdenum oxide ($MoO_x$), or zinc oxide (ZnO).

In an embodiment, a portion of the second metal layer facing the first opening of the metal bank layer may include a tip extending from a point where a bottom surface of the second metal layer contacts a lateral surface of the first metal layer, to the first opening.

In an embodiment, a length from the point to a lateral surface of the tip may be about 0.3 micrometer ($\mu m$) to about 1 $\mu m$.

In an embodiment, the display apparatus may further include a protective layer disposed between the outer portion of the first sub-pixel electrode and the insulating layer.

In an embodiment, the protective layer may include a transparent conductive oxide.

In an embodiment, an outer portion of the first opposite electrode may directly contact a lateral surface of the first metal layer facing the first opening of the metal bank layer.

In an embodiment, the display apparatus may further include a first dummy intermediate layer including a same material as a material of the first intermediate layer and disposed on the low-reflective layer.

In an embodiment, the display apparatus may further include a first dummy opposite electrode including a same material as a material of the first opposite electrode and disposed on the first dummy intermediate layer.

In an embodiment, the display apparatus may further include a second sub-pixel electrode adjacent to the first sub-pixel electrode, a second intermediate layer overlapping the second sub-pixel electrode through a second opening of the metal bank layer, and a second opposite electrode overlapping the second intermediate layer through the second opening of the metal bank layer.

In an embodiment, a groove may be defined in the metal bank layer between the first sub-pixel electrode and the second sub-pixel electrode, and the groove may be concave with respect to an upper surface of the metal bank layer.

In an embodiment, the first dummy intermediate layer may include a plurality of first dummy portions separated from each other with the groove therebetween.

In an embodiment of the disclosure, a method of manufacturing a display apparatus includes forming a first sub-pixel electrode, forming an insulating layer overlapping an outer portion of the first sub-pixel electrode, forming a metal bank layer in which a first opening overlapping the first sub-pixel electrode is defined, the metal bank layer including a first metal layer and a second metal layer on the first metal layer, forming a first intermediate layer overlapping the first sub-pixel electrode through the first opening of the metal bank layer, forming a first opposite electrode disposed on the first intermediate layer through the first opening of the metal bank layer, and forming a low-reflective layer disposed on the second metal layer of the metal bank layer and having a reflectivity less than a reflectivity of the second metal layer.

In an embodiment, the low-reflective layer may include a metal oxide.

In an embodiment, the low-reflective layer may include at least one of copper oxide (CuO), calcium oxide (CaO), molybdenum oxide ($MoO_x$), or zinc oxide (ZnO).

In an embodiment, the forming the metal bank layer may include defining an opening in each of the first metal layer and the second metal layer. The opening overlaps the first sub-pixel electrode, and selectively etching the second metal layer of the first metal layer and the second metal layer. The second metal layer may include a tip extending from a point where a bottom surface of the second metal layer contacts a lateral surface of the first metal layer, to the first opening.

In an embodiment, the method may further include forming a protective layer disposed between the outer portion of the first sub-pixel electrode and the insulating layer and including a transparent conductive oxide.

In an embodiment, the forming the first opposite electrode may include depositing the first opposite electrode such that an outer portion of the first opposite electrode directly contacts a lateral surface of the first metal layer facing the first opening of the metal bank layer.

In an embodiment, the method may further include forming a second sub-pixel electrode adjacent to the first sub-pixel electrode, and forming a groove in the metal bank layer, the groove being between the first sub-pixel electrode and the second sub-pixel electrode.

BRIEF DESCRIPTION OF THE DRAWINGS

The above and other features and advantages of illustrative embodiments of the disclosure will be more apparent from the following description taken in conjunction with the accompanying drawings, in which.

DETAILED DESCRIPTION

Figure 1A:
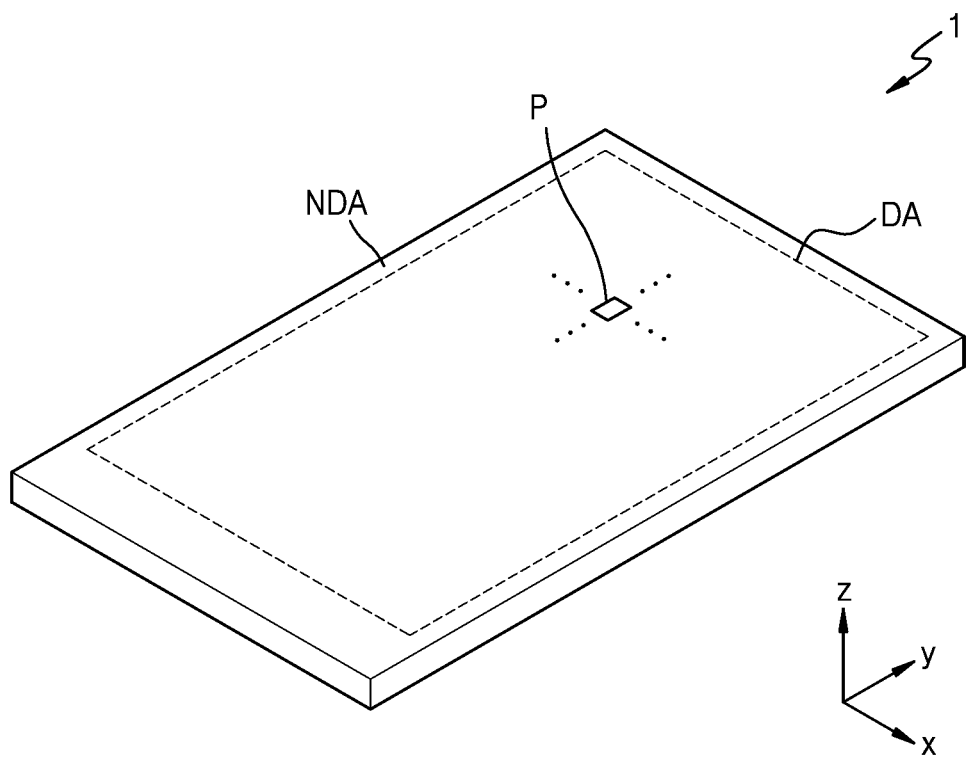
FIGS. 1A and 1B are schematic perspective views of an embodiment of a display apparatus.

Reference will now be made in detail to embodiments, illustrative embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" or "at least one selected from among a, b, and c" indicates only a, only b, only c, both a and b, both a and c, both b and c, all of a, b, and c, or variations thereof.

As the disclosure allows for various changes and numerous embodiments, illustrative embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, where like reference numerals refer to like elements throughout and a repeated description thereof is omitted.

While terms such as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. As an example, the size and thickness of each element shown in the drawings are arbitrarily represented for convenience of description, and thus, the present disclosure is not necessarily limited thereto.

In the case where an illustrative embodiment may be implemented differently, a specific process order may be performed in the order different from the described order. As an example, two processes successively described may be simultaneously performed substantially or performed in the opposite order.

In the specification, "A and/or B" means A or B, or A and B.

It will be understood that when a layer, region, or component is referred to as being "connected" to another layer, region, or component, it may be "directly connected" to the other layer, region, or component or may be "indirectly connected" to the other layer, region, or component with other layer, region, or component located therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component located therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 1B:
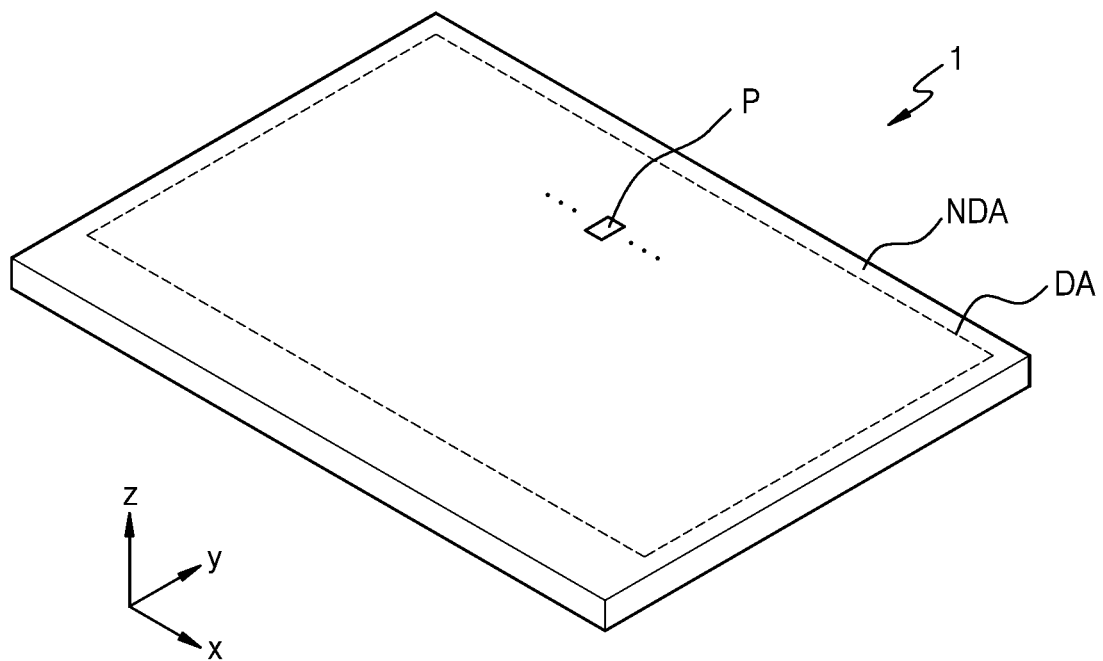

FIGS. 1A and 1B are schematic perspective views of an embodiment of a display apparatus 1.

Referring to FIGS. 1A and 1B, the display apparatus 1 may include a display area DA and a non-display area NDA outside the display area DA. The display area DA may display images by sub-pixels P arranged in the display area DA. The non-display area NDA is arranged outside the display area DA, and is a non-display area in which images are not displayed. The non-display area NDA may surround an entirety of the display area DA. A driver or the like which provides electrical signals or power to the display area DA may be arranged in the non-display area NDA. A pad may be arranged in the non-display area NDA, and the pad may be a region to which electronic elements or a printed circuit board may be electrically connected.

In an embodiment, though it is shown in FIG. 1A that the display area DA is a polygon (e.g., a quadrangle) in which the length of the display area DA in an x direction is less than the length of the display area DA in an y direction, the display area DA may be a polygon (e.g., a quadrangle) in which the length of the display area DA in the y direction is less than the length of the display area DA in the x direction in another embodiment. Though it is shown in FIGS. 1A and 1B that the display area DA is approximately a quadrangle, the disclosure is not limited thereto. As another embodiment, the display area DA may have an N-gonal shape (N is a natural number equal to or greater than 3), or may have various shapes such as a circular shape or an elliptical shape. Though it is shown in FIGS. 1A and 1B that a corner portion of the display area DA has a shape including a vertex at which a straight line meets a straight line, the display area DA may be a polygon including a round corner in another embodiment.

Hereinafter, for convenience of description, though the case where the display apparatus 1 is a smartphone is described, the display apparatus 1 according to the disclosure is not limited thereto. The display apparatus 1 is applicable to various products including televisions, notebook computers, monitors, advertisement boards, screens for theaters, Internet of things ("IoTs") apparatuses as well as portable electronic apparatuses including mobile phones, smart phones, tablet personal computers, mobile communication terminals, electronic organizers, electronic books, portable multimedia players ("PMPs"), navigations, and ultra-mobile personal computers ("UMPCs"). In addition, the display apparatus 1 in an embodiment is applicable to wearable devices including smartwatches, watchphones, glasses-type displays, and head-mounted displays ("HMDs"). In addition, in an embodiment, the display apparatus 1 is applicable to a display screen in instrument panels for automobiles, center fascias for automobiles, or center information displays ("CIDs") arranged on a dashboard, room mirror displays that replace side mirrors of automobiles, and displays arranged on the backside of front seats as an entertainment for back seats of automobiles.

Figure 2A:
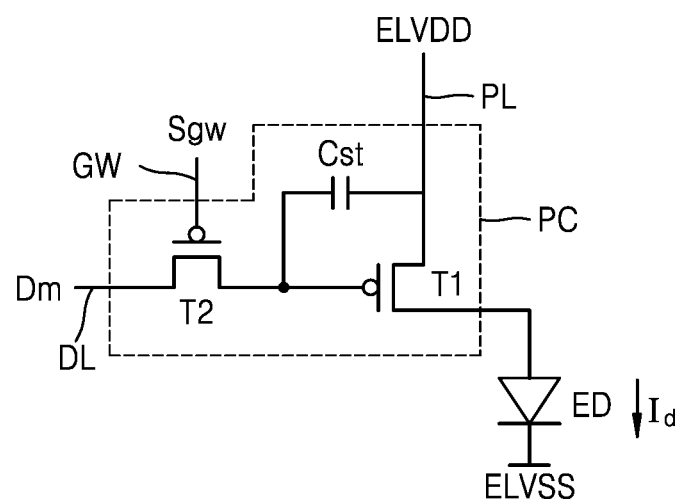
FIGS. 2A and 2B is a schematic equivalent circuit diagram of an embodiment of a light-emitting diode corresponding to one of sub-pixels of a display apparatus and a sub-pixel circuit electrically connected to the light-emitting diode.

FIG. 2A is a schematic equivalent circuit diagram of a light-emitting diode corresponding to one of sub-pixels of a display apparatus and a sub-pixel circuit electrically connected to the light-emitting diode.

Referring to FIG. 2A, a light-emitting diode ED may be electrically connected to a sub-pixel circuit PC, and the sub-pixel circuit PC may include a first transistor T1, a second transistor T2, and a storage capacitor Cst.

The second transistor T2 transfers a data signal Dm to the first transistor T1 according to a scan signal Sgw input through a scan line GW, and the data signal Dm may be input through a data line DL.

The storage capacitor Cst is connected to the second transistor T2 and a driving voltage line PL and stores a voltage corresponding to a difference between a voltage transferred from the second transistor T2 and a driving voltage ELVDD supplied to the driving voltage line PL.

The first transistor T1 may be connected to the driving voltage line PL and the storage capacitor Cst and may control a driving current Id according to the voltage stored in the storage capacitor Cst, the driving current Id flowing from the driving voltage line PL to the light-emitting diode ED. The light-emitting diode ED may emit light having a preset brightness based on the driving current Id.

Though it is described with reference to FIG. 2A that the sub-pixel circuit PC includes two transistors and one storage capacitor, the disclosure is not limited thereto.

Figure 2B:
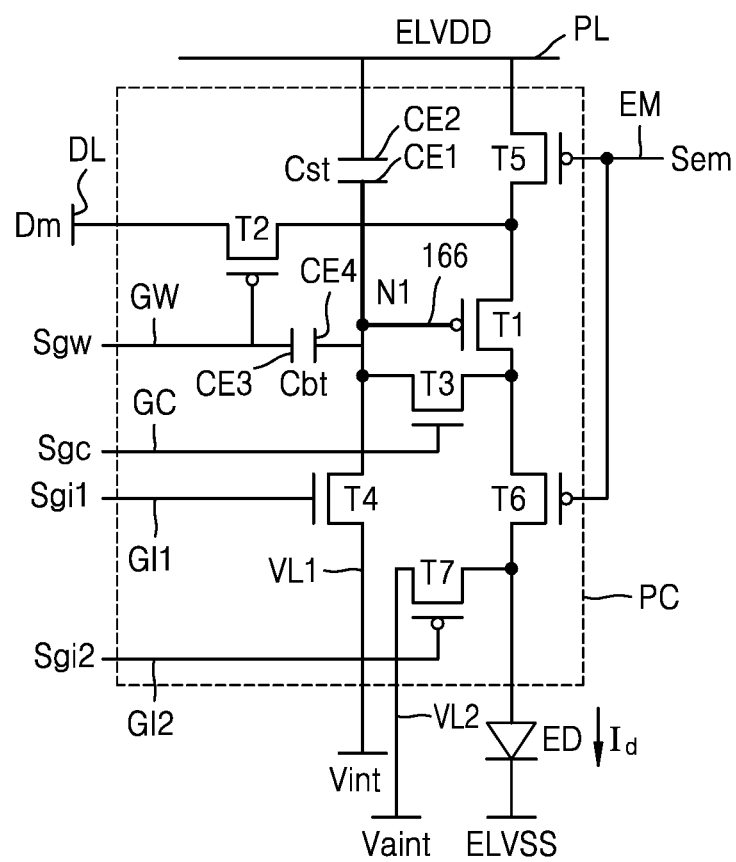

FIG. 2B is a schematic equivalent circuit diagram of a light-emitting diode corresponding to one of sub-pixels of a display apparatus and a sub-pixel circuit electrically connected to the light-emitting diode.

Referring to FIG. 2B, the sub-pixel circuit PC may include seven transistors and two capacitors.

The sub-pixel circuit PC may include first to seventh transistors T1, T2, T3, T4, T5, T6, and T7, a storage capacitor Cst, and a boost capacitor Cbt. In another embodiment, the sub-pixel circuit PC may not include the boost capacitor Cbt.

Some of the first to seventh transistors T1, T2, T3, T4, T5, T6, and T7 may be n-channel metal oxide semiconductor ("NMOS") field-effect transistors ("n-channel MOSFETs"), and the rest may be p-channel metal oxide semiconductor ("PMOS") field-effect transistors ("p-channel MOSFETs"). In an embodiment, as shown in FIG. 2B, the third and fourth transistors T3 and T4 may be n-channel MOSFETs, and the rest may be p-channel MOSFETs. In an embodiment, the third and fourth transistors T3 and T4 may be n-channel MOSFETs including an oxide-based semiconductor material, and the rest may be p-channel MOSFETs including a silicon-based semiconductor material. In another embodiment, the third, fourth, and seventh transistors T3, T4, and T7 may be n-channel MOSFETs, and the rest may be p-channel MOSFETs.

The first to seventh transistors T1, T2, T3, T4, T5, T6, and T7, the storage capacitor Cst, and the boost capacitor Cbt may be connected to signal lines. The signal lines may include the scan line GW, an emission control line EM, a compensation gate line GC, a first initialization gate line GI1, a second initialization gate line GI2, and the data line DL. The sub-pixel circuit PC may be electrically connected to a voltage line, e.g., the driving voltage line PL, a first initialization voltage line VL1, and a second initialization voltage line VL2.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a first electrode (e.g., an anode) of the light-emitting diode ED through the sixth transistor T6. One of the first electrode and the second electrode of the first transistor T1 may be a source electrode, and the other may be a drain electrode. The first transistor T1 may supply the driving current Id to the light-emitting diode ED according to a switching operation of the second transistor T2. In an embodiment, a common voltage ELVSS may be applied to a second electrode (e.g., a cathode) of the light-emitting diode ED.

The second transistor T2 may be a switching transistor. A second gate electrode of the second transistor T2 is connected to the scan line GW, a first electrode of the second transistor T2 is connected to the data line DL, and a second electrode of the second transistor T2 is connected to the first electrode of the first transistor T1 and electrically connected to the driving voltage line PL through the fifth transistor T5. One of the first electrode and the second electrode of the second transistor T2 may be a source electrode, and the other may be a drain electrode. The second transistor T2 may be turned on according to a scan signal Sgw transferred through the scan line GW and may perform a switching operation of transferring a data signal Dm to the first electrode of the first transistor T1. The data signal Dm may be transferred through the data line DL.

The third transistor T3 may be a compensation transistor which compensates for a threshold voltage of the first transistor T1. A third gate electrode of the third transistor T3 is connected to a compensation gate line GC. A first electrode of the third transistor T3 is connected to the lower electrode CE1 of the storage capacitor Cst and connected to the first gate electrode of the first transistor T1 through a node connection line 166. A first electrode of the third transistor T3 may be connected to the fourth transistor T4. A second electrode of the third transistor T3 is connected to the second electrode of the first transistor T1 and electrically connected to the first electrode (e.g., the anode) of the light-emitting diode ED through the sixth transistor T6. One of the first electrode and the second electrode of the third transistor T3 may be a source electrode, and the other may be a drain electrode.

The third transistor T3 is turned on according to a compensation signal Sgc transferred through the compensation gate line GC, and diode-connects the first transistor T1 by electrically connecting the first gate electrode to the second electrode (e.g., the drain electrode) of the first transistor T1.

The fourth transistor T4 may be a first initialization transistor which initializes the first gate electrode of the first transistor T1. A fourth gate electrode of the fourth transistor T4 is connected to a first initialization gate line GI1. A first electrode of the fourth transistor T4 is connected to a first initialization voltage line VL1. A second electrode of the fourth transistor T4 may be connected to the lower electrode CE1 of the storage capacitor Cst, the first electrode of the third transistor T3, and the first gate electrode of the first transistor T1. One of the first electrode and the second electrode of the fourth transistor T4 may be a source electrode, and the other may be a drain electrode. The fourth transistor T4 may be turned on according to a first initialization signal Sgi1 transferred through the first initialization gate line GI1 and may perform an initialization operation of initializing the voltage of the first gate electrode of the first transistor T1 by transferring a first initialization voltage Vint to the first gate electrode of the driving transistor T1.

The fifth transistor T5 may be an operation control transistor. A fifth gate electrode of the fifth transistor T5 is connected to the emission control line EM, a first electrode of the fifth transistor T5 is connected to the driving voltage line PL, and a second electrode of the fifth transistor T5 is connected to the first electrode of the first transistor T1 and the second electrode of the second transistor T2. One of the first electrode and the second electrode of the fifth transistor T5 may be a source electrode, and the other may be a drain electrode.

The sixth transistor T6 may be an emission control transistor. A sixth gate electrode of the sixth transistor T6 is connected to the emission control line EM, a first electrode of the sixth transistor T6 is connected to the second electrode of the first transistor T1 and the second electrode of the third transistor T3, and a second electrode of the sixth transistor T6 is electrically connected to a second electrode of the seventh transistor T7 and the first electrode (e.g., the anode) of the light-emitting diode ED. One of the first electrode and the second electrode of the sixth transistor T6 may be a source electrode, and the other may be a drain electrode.

The fifth transistor T5 and the sixth transistor T6 may be simultaneously turned on according to an emission control signal Sem transferred through the emission control line EM, the driving voltage ELVDD is transferred to the light-emitting diode ED, and the driving current Id flows through the light-emitting diode ED.

The seventh transistor T7 may be a second initialization transistor which initializes the first electrode of the light-emitting diode ED. A seventh gate electrode of the seventh transistor T7 is connected to a second initialization gate line GI2. A first electrode of the seventh transistor T7 is connected to a second initialization voltage line VL2. A second electrode of the seventh transistor T7 is connected to the second electrode of the sixth transistor T6 and the first electrode (e.g., the anode) of the light-emitting diode ED. The seventh transistor T7 may be turned on according to a second initialization signal Sgi2 transferred through the second initialization gate line GI2, and may initialize the first electrode of the light-emitting diode ED by transferring a second initialization voltage Vaint to the first electrode (e.g., the anode) of the light-emitting diode ED.

In an embodiment, the second initialization voltage line VL2 may be a next scan line. In an embodiment, the second initialization gate line GI2 connected to the seventh transistor T7 of the sub-pixel circuit PC and arranged in an i-th row (i is a natural number) may correspond to a scan line of the sub-pixel circuit PC arranged in an (i+1)-th row. In another embodiment, the second initialization voltage line VL2 may be the emission control line EM. In an embodiment, the emission control line EM may be electrically connected to the fifth to seventh transistors T5, T6, and T7.

The storage capacitor Cst includes a lower electrode CE1 and an upper electrode CE2. The lower electrode CE1 of the storage capacitor Cst is connected to the first gate electrode of the first transistor T1, and the upper electrode CE2 of the storage capacitor Cst is connected to the driving voltage line PL. The storage capacitor Cst may store charge corresponding to a difference between a voltage of the first gate electrode of the first transistor T1 and the driving voltage ELVDD.

The boost capacitor Cbt includes a third electrode CE3 and a fourth electrode CE4. The third electrode CE3 may be connected to the second gate electrode of the second transistor T2 and the scan line GW, and the fourth electrode CE4 may be connected to the first electrode of the third transistor T3 and the node connection line 166. The boost capacitor Cbt may raise the voltage of a first node N1 when a scan signal Sgw supplied to the scan line GW is turned off. When the voltage of the first node N1 is raised, a black grayscale may be clearly expressed.

The first node N1 may be a region where the first gate electrode of the first transistor T1, the first electrode of the third transistor T3, the second electrode of the fourth transistor T4, and the fourth electrode CE4 of the boost capacitor Cbt are connected to each other.

In an embodiment, it is described in FIG. 2B that the third and fourth transistors T3 and T4 are n-channel MOSFETs, and the first, second, and fifth to seventh transistors T1, T2, T5, T6, and T7 are p-channel MOSFETs. The first transistor T1 directly influencing the brightness of the display apparatus displaying images may include a semiconductor layer including polycrystalline silicon having high reliability, and thus, a high-resolution display apparatus may be implemented through this configuration.

Though it is described in FIG. 2B that some of the transistors are NMOSFETs and the rest are PMOSFETs, the disclosure is not limited thereto. In another embodiment, the sub-pixel circuit PC may include three transistors, and all of the three transistors may be NMOSFETs. However, various modifications may be made.

Figure 3A:
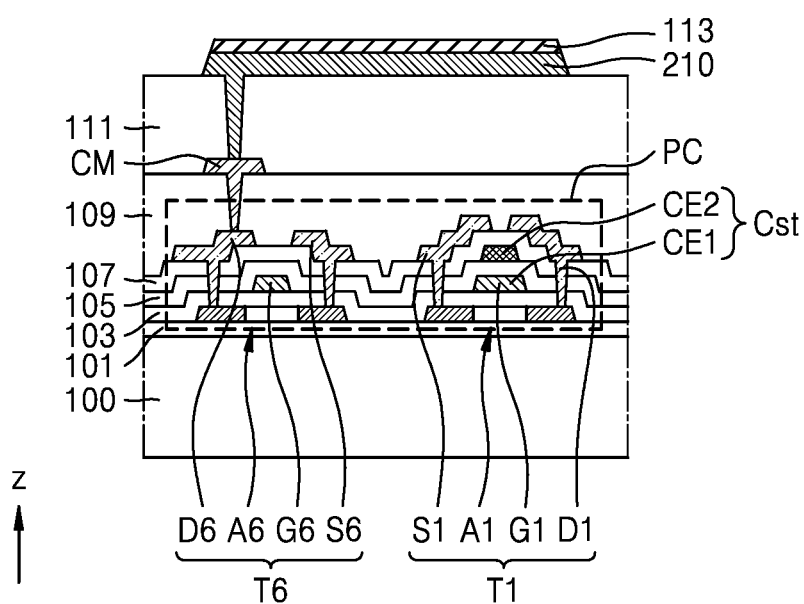
FIGS. 3A to 3J are schematic cross-sectional views showing an embodiment of states of a process of manufacturing a display apparatus.
Figure 3B:
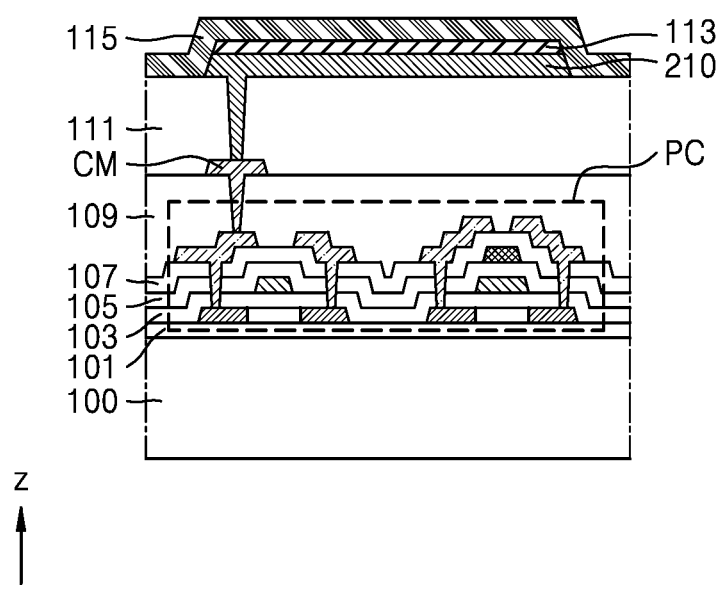
Figure 3C:
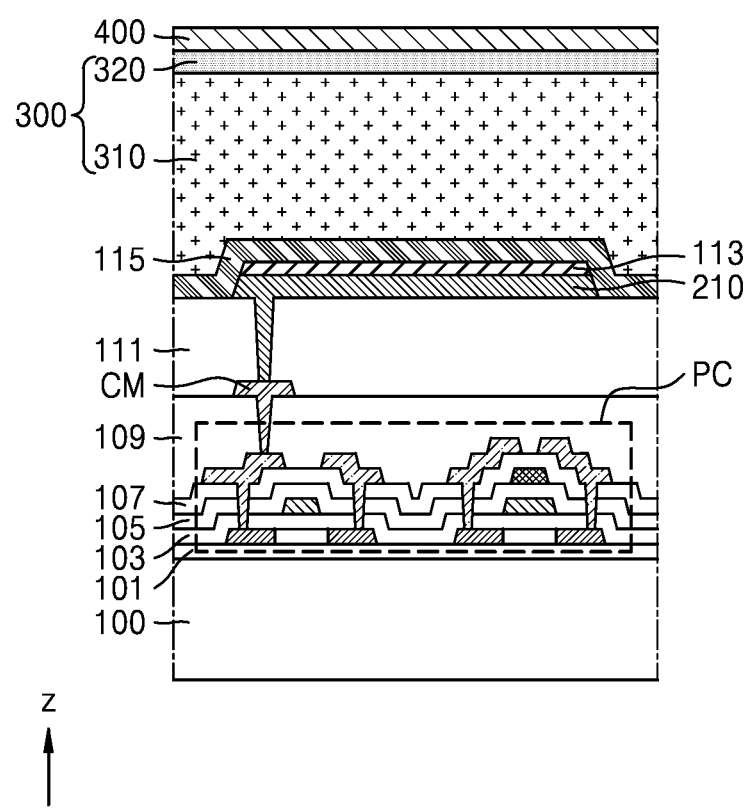
Figure 3D:
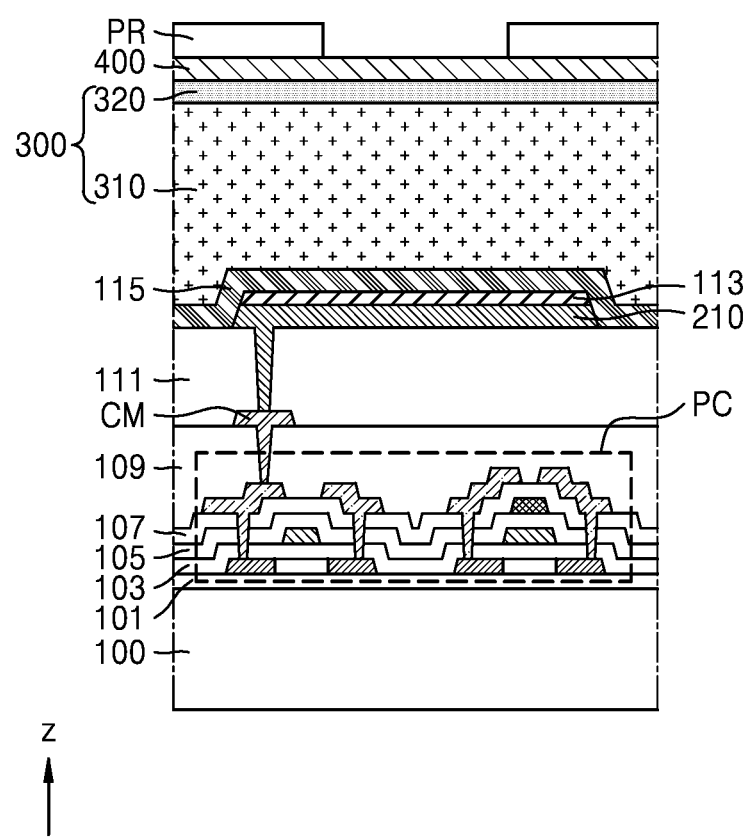
Figure 3E:
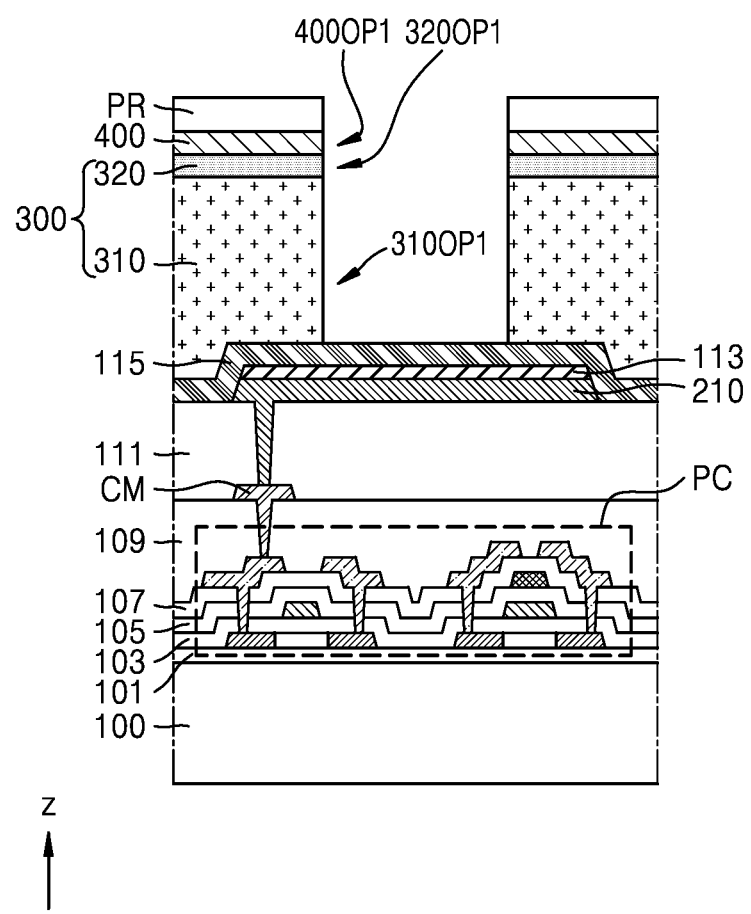
Figure 3F:
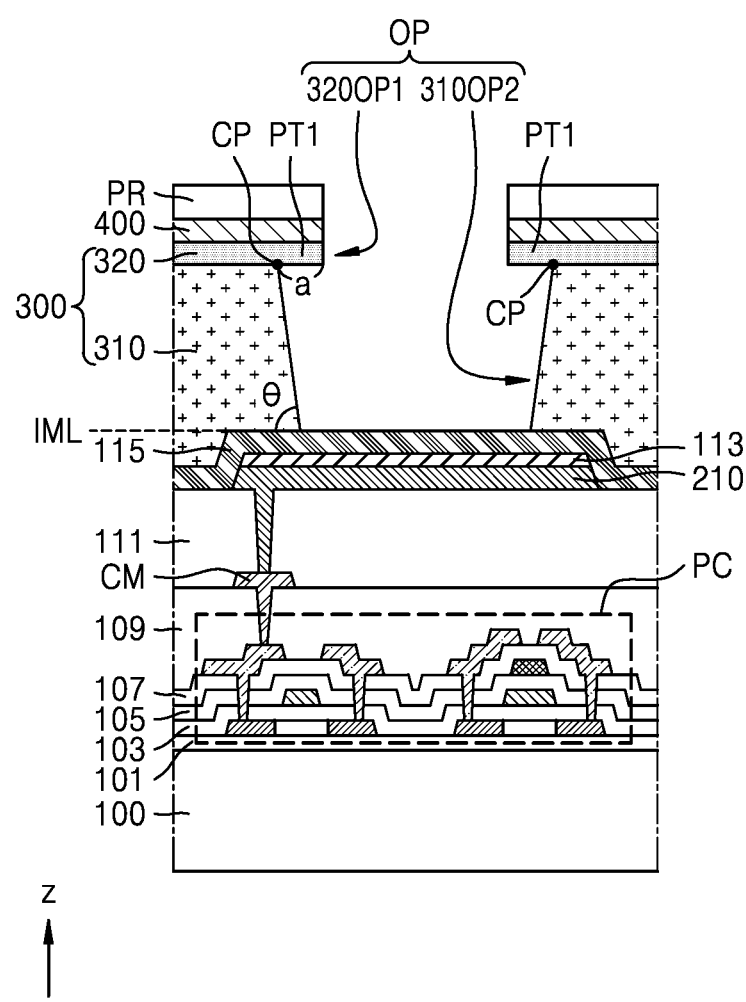
Figure 3G:
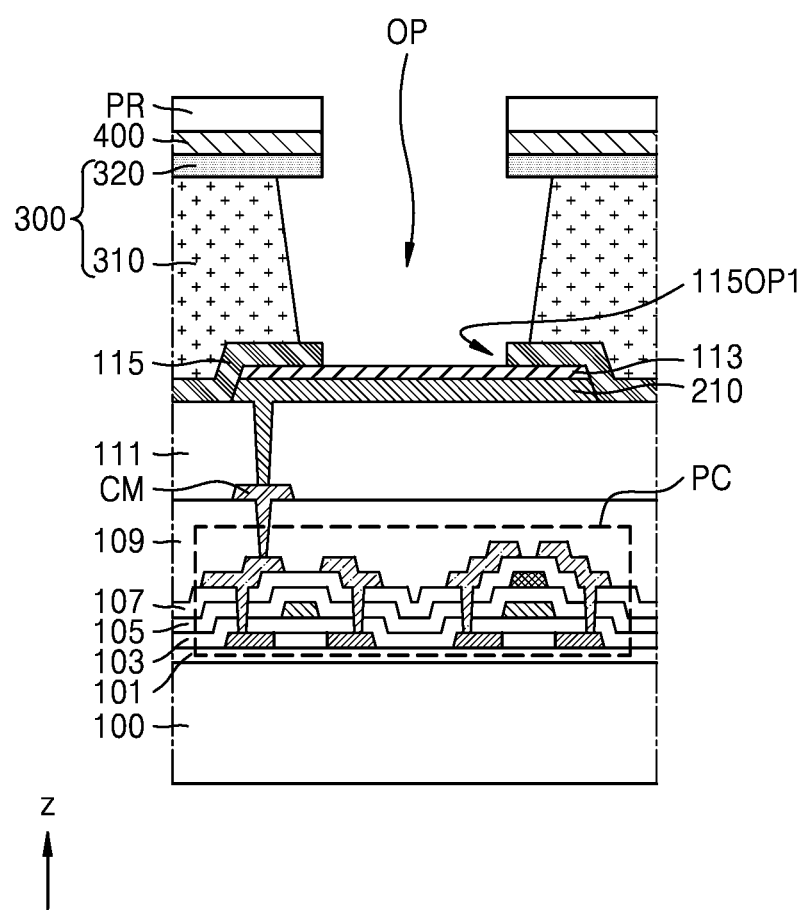
Figure 3H:
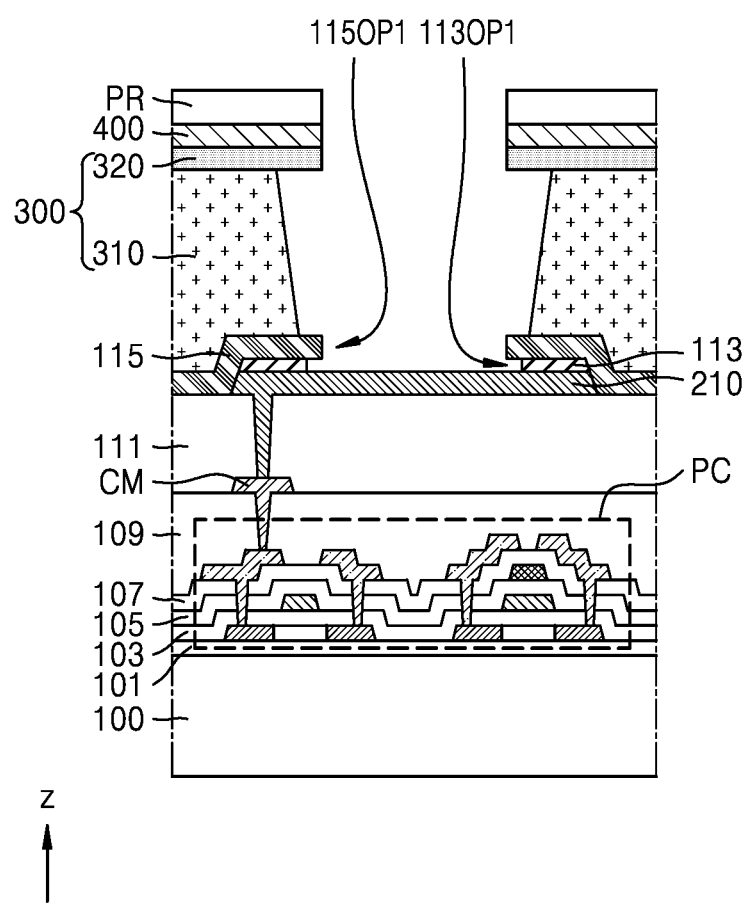
Figure 3I:
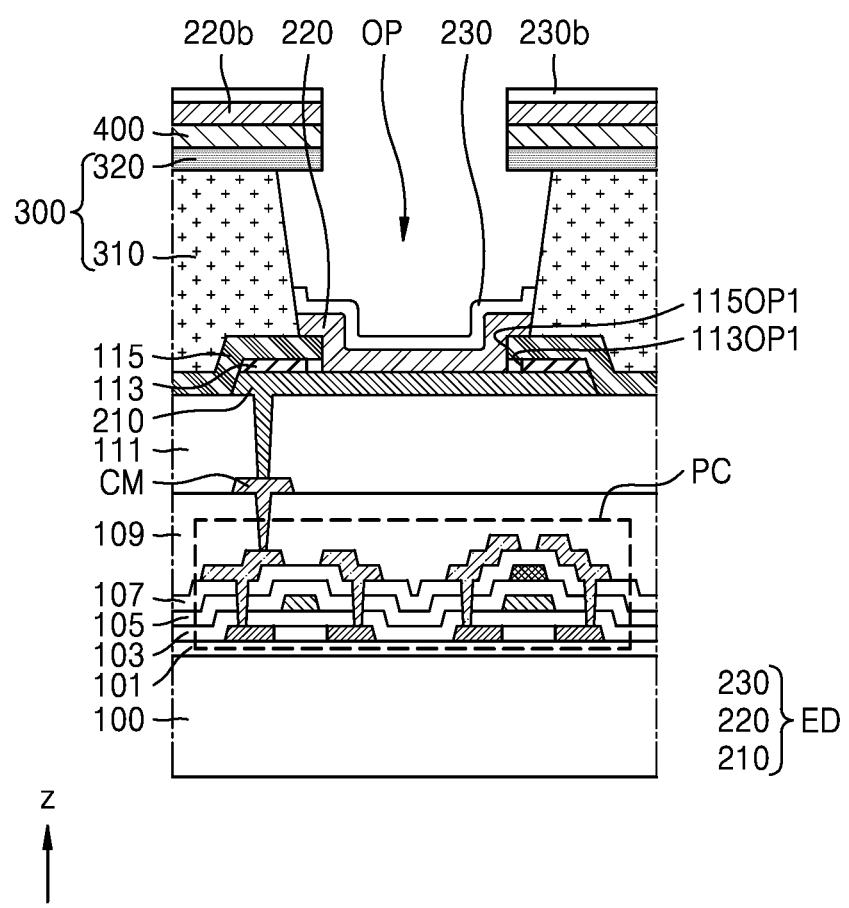
Figure 3J:
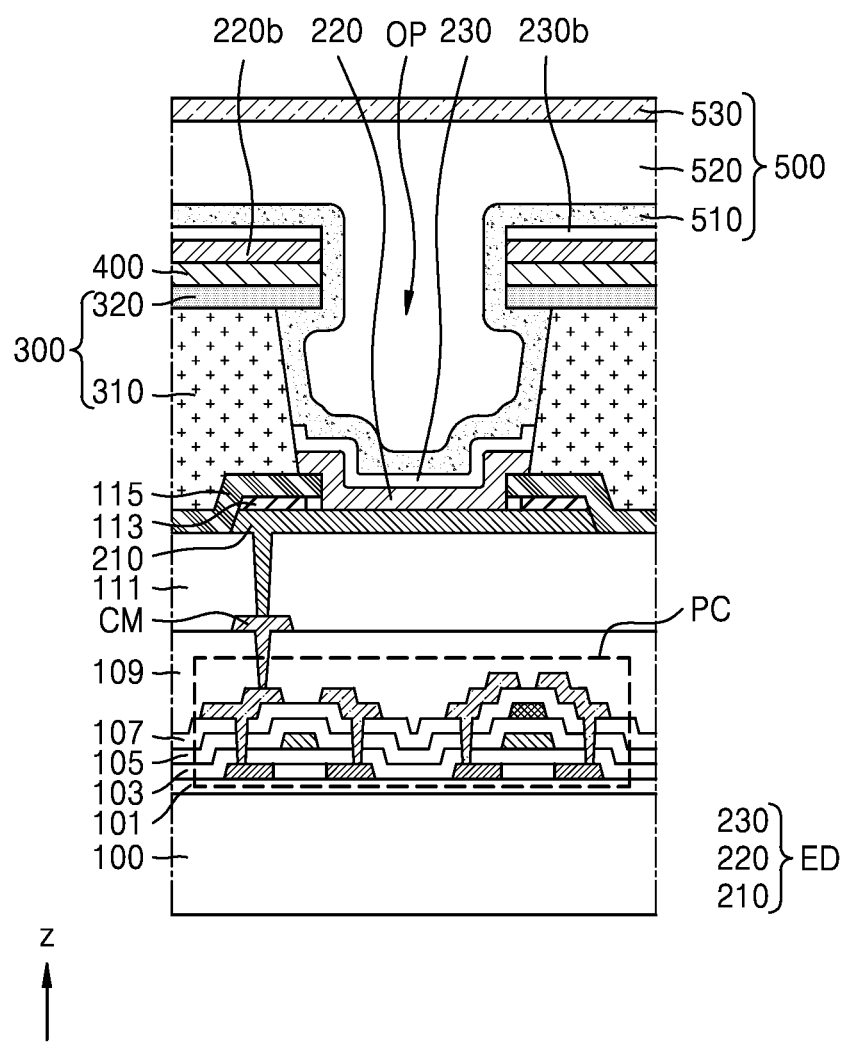
Figure 3K:
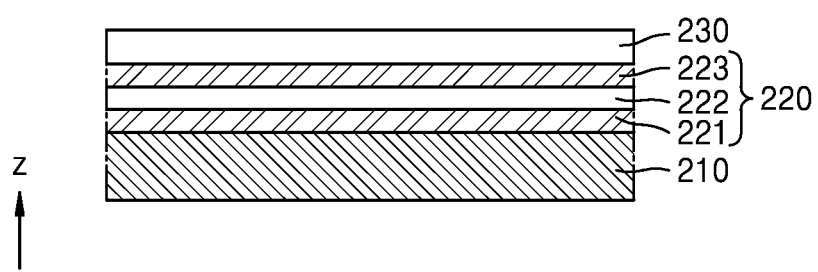
FIG. 3K is a cross-sectional view of an embodiment of a stack structure of a light-emitting diode.

FIGS. 3A to 3J are schematic cross-sectional views showing an embodiment of states of a process of manufacturing a display apparatus, and FIG. 3K is a cross-sectional view of an embodiment of a stack structure of a light-emitting diode.

Referring to FIG. 3A, the sub-pixel circuit PC may be formed on the substrate 100. The substrate 100 may include glass or polymer resin. The substrate 100 may have a structure in which a base layer including a polymer resin and an inorganic barrier layer are stacked. The polymer resin may include polyethersulphone ("PES"), polyacrylate ("PAR"), polyetherimide ("PEI"), polyethylene naphthalate ("PEN"), polyethylene terephthalate ("PET"), polyphenylene sulfide ("PPS"), polyarylate, polyimide ("PI"), polycarbonate, cellulose tri acetate ("TAC"), and cellulose acetate propionate ("CAP").

A buffer layer 101 may be disposed on the upper surface of the substrate 100. The buffer layer 101 may prevent impurities from penetrating a semiconductor layer of the transistor. The buffer layer 101 may include an inorganic insulating material such as silicon nitride, silicon oxynitride, or silicon oxide, and include a single layer or a multi-layer including the above inorganic insulating materials.

The sub-pixel circuit PC may be disposed on the buffer layer 101. As described above with reference to FIG. 2A or 2B, the sub-pixel circuit PC may include the plurality of transistors and the storage capacitor. In an embodiment, FIG. 3A shows the first transistor T1, the sixth transistor T6, and the storage capacitor Cst of the sub-pixel circuit PC.

The first transistor T1 may include a first semiconductor layer A1 and a first gate electrode G1, and the first semiconductor layer A1 is on the buffer layer 101, and the first gate electrode G1 overlaps a channel region of the first semiconductor layer A1. The first semiconductor layer A1 may include a silicon-based semiconductor material, e.g., polycrystalline silicon. The first semiconductor layer A1 may include a channel region, a first region, and a second region, the first region and the second region being on two opposite sides of the channel region. The first region and the second region are regions including impurities of higher concentration than a concentration of the channel region. One of the first region and the second region may correspond to a source region, and the other may correspond to a drain region.

The sixth transistor T6 may include a sixth semiconductor layer A6 and a sixth gate electrode G6. The sixth semiconductor layer A6 may be on the buffer layer 101, and the sixth gate electrode G6 may overlap a channel region of the sixth semiconductor layer A6. The sixth semiconductor layer A6 may include a silicon-based semiconductor material, e.g., polycrystalline silicon. The sixth semiconductor layer A6 may include a channel region, a first region, and a second region, the first region and the second region being on two opposite sides of the channel region. The first region and the second region are regions including impurities of higher concentration than a concentration of the channel region. One of the first region and the second region may correspond to a source region, and the other may correspond to a drain region.

The first gate electrode G1 and the sixth gate electrode G6 may include a conductive material including molybdenum (Mo), aluminum (Al), copper (Cu), and/or titanium (Ti) and have a single-layered structure or a multi-layered structure including the above materials. A first gate insulating layer 103 may be disposed under the first gate electrode G1 and the sixth gate electrode G6. The first gate insulating layer 103 may be for electrical insulation between the first semiconductor layer A1 and the first gate electrode G1 and between the sixth semiconductor layer A6 and the sixth gate electrode G6. The first gate insulating layer 103 may include an inorganic insulating material such as silicon nitride, silicon oxynitride, or silicon oxide, and include a single layer or a multi-layer including the above inorganic insulating materials.

The storage capacitor Cst may include the lower electrode CE1 and the upper electrode CE2 overlapping each other. In an embodiment, the lower electrode CE1 of the storage capacitor Cst may include the first gate electrode G1. In other words, the first gate electrode G1 may include the lower electrode CE1 of the storage capacitor Cst. In an embodiment, the first gate electrode G1 and the lower electrode CE1 of the storage capacitor Cst may be one body.

A first inter-insulating layer 105 may be disposed between the lower electrode CE1 and the upper electrode CE2 of the storage capacitor Cst. The first inter-insulating layer 105 may include an inorganic insulating material such as silicon nitride, silicon oxynitride, or silicon oxide, and have a single-layered structure or a multi-layered structure including the above inorganic insulating materials.

The upper electrode CE2 of the storage capacitor Cst may include a conductive material of a low-resistance material such as molybdenum (Mo), aluminum (Al), copper (Cu) and/or titanium (Ti), and have a single-layered structure or a multi-layered structure including the above materials.

A second inter-insulating layer 107 may be disposed on the storage capacitor Cst. The second inter-insulating layer 107 may include an inorganic insulating material such as silicon nitride, silicon oxynitride, or silicon oxide, and have a single-layered structure or a multi-layered structure including the above inorganic insulating materials.

A source electrode S1 and/or a drain electrode D1 electrically connected to the first semiconductor layer A1 of the first transistor T1 may be disposed on the second inter-insulating layer 107. A source electrode S6 and/or a drain electrode D6 electrically connected to the sixth semiconductor layer A6 of the sixth transistor T6 may be disposed on the second inter-insulating layer 107. The source electrodes S1 and S6 and/or the drain electrodes D1 and D6 may include aluminum (Al), copper (Cu), and/or titanium (Ti), and include a single layer or a multi-layer including the above materials.

A first organic insulating layer 109 may be disposed on the sub-pixel circuit PC. The first organic insulating layer 109 may include an organic insulating material such as acryl, benzocyclobutene ("BCB"), polyimide, or hexamethyldisiloxane ("HMDSO").

A connection metal CM may be disposed on the first organic insulating layer 109. The connection metal CM may include aluminum (Al), copper (Cu), and/or titanium (Ti), and include a single layer or a multi-layer including the above materials.

A second organic insulating layer 111 may be disposed between the connection metal CM and a sub-pixel electrode 210. The second organic insulating layer 111 may include an organic insulating material such as acryl, BCB, polyimide, or HMDSO. According to the embodiment described with reference to FIG. 3A, though it is shown that the sub-pixel circuit PC is electrically connected to the sub-pixel electrode 210 through the connection metal CM, the connection metal CM may be omitted and one organic insulating layer may be disposed between the sub-pixel circuit PC and the sub-pixel electrode 210 in another embodiment. In an alternative embodiment, three or more organic insulating layers may be disposed between the sub-pixel circuit PC and the sub-pixel electrode 210, and the sub-pixel circuit PC may be electrically connected to the sub-pixel electrode 210 through a plurality of connection metals.

The sub-pixel electrode 210 may be formed on the second organic insulating layer 111. The sub-pixel electrode 210 may be formed to be a (semi) transparent electrode or a reflective electrode. In the case where the sub-pixel electrode 210 includes a (semi) transparent electrode, the sub-pixel electrode 210 may include indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In the case where the sub-pixel electrode 210 includes a reflective electrode, the reflective electrode may be formed by silver (Ag), magnesium (Mg), aluminum (Al), platinum (Pt), palladium (Pd), gold (Au), nickel (Ni), neodymium (Nd), iridium (Ir), chrome (Cr), or any combinations thereof, and a layer may be formed on the reflective electrode, and the layer may include ITO, IZO, ZnO, or $In_2O_3$. In an embodiment, the sub-pixel electrode 210 may have a structure of an ITO layer, an Ag layer, and an ITO layer that are sequentially stacked. The sub-pixel electrode 210 may be electrically connected to the connection metal CM through a contact hole of the second organic insulating layer 111.

A protective layer 113 may be formed on the sub-pixel electrode 210. The protective layer 113 may be patterned together with the sub-pixel electrode 210. In an embodiment, the sub-pixel electrode 210 and the protective layer 113 may be formed by the same mask. The protective layer 113 may prevent the sub-pixel electrode 210 from being damaged by a gas, liquid material, or the like used during various etching processes, ashing processes, or the like included in the process of manufacturing the display apparatus. The protective layer 113 may include a conductive oxide such as indium tin oxide ("ITO"), indium zinc oxide ("IZO"), indium gallium zinc oxide ("IGZO"), indium tin zinc oxide ("ITZO"), zinc oxide (ZnO), aluminum doped zinc oxide ("AZO"), gallium doped zinc oxide ("GZO"), zinc tin oxide ("ZTO"), gallium tin oxide ("GTO"), or fluorine doped tin oxide ("FTO").

Referring to FIG. 3B, an insulating layer 115 may be formed on the structure shown in FIG. 3A. The insulating layer 115 may be formed over an entirety of the substrate 100. In an embodiment, the insulating layer 115 may overlap the sub-pixel electrode 210 and the protective layer 113 and directly contact the upper surface of the second organic insulating layer 111 on which the sub-pixel electrode 210 and the protective layer 113 do not exist. The insulating layer 115 may include an inorganic insulating layer. In the case where the insulating layer 115 includes an inorganic insulating material, deterioration in the quality of the light-emitting diode due to a gas emitted from an insulating layer, which is an organic insulating material, during the process of manufacturing the display apparatus may be prevented or reduced compared to the case where the insulating layer 115 includes an organic insulating material.

The insulating layer 115 may include an inorganic insulating material such as silicon nitride, silicon oxynitride, or silicon oxide, and have a single-layered structure or a multi-layered structure including the above inorganic insulating materials. In an embodiment, the insulating layer 115 may have a double-layered structure of a silicon oxide layer and a silicon nitride layer. The thickness of the silicon oxide layer may be less than the thickness of the silicon nitride layer. In an embodiment, the thickness of the insulating layer 115 may be less than the thickness of the protective layer 113. In an embodiment, the thickness of the insulating layer 115 may be about 1000 angstroms (Å), and the thickness of the protective layer 113 may be about 500 Å, but the disclosure is not limited thereto.

Referring to FIG. 3C, a metal bank layer 330 and a low-reflective layer 400 may be formed on the insulating layer 115 shown in FIG. 3B. The metal bank layer 300 may include a first metal layer 310 and a second metal layer 320 on the first metal layer 310.

The first metal layer 310 and the second metal layer 320 may include different metals, respectively. In an embodiment, the first metal layer 310 and the second metal layer 320 may include different metals with different etching selectivities, respectively. In an embodiment, the first metal layer 310 may be a layer including Al, and the second metal layer 320 may be a layer including Ti.

The thickness of the first metal layer 310 may be greater than the thickness of the second metal layer 320. In an embodiment, the thickness of the first metal layer 310 may be about five times greater than the thickness of the second metal layer 320. In another embodiment, the thickness of the first metal layer 310 may be about six times, about seven times, or about eight times greater than the thickness of the second metal layer 320. In an embodiment, the thickness of the first metal layer 310 may be about 4000 Å to about 8000 Å, and the thickness of the second metal layer 320 may be about 500 Å to about 800 Å. The thickness of the first metal layer 310 may be about four times or more, or about five times or more, or about six times or more of the thickness of the insulating layer 115.

The low-reflective layer 400 may be a layer having a surface reflectivity less than a surface reflectivity of a metal layer directly thereunder, e.g., the second metal layer 320. The low-reflective layer 400 may prevent light (external light) incident toward the display apparatus from being reflected by the surface of the second metal layer 320 and viewed by users of the display apparatus after the display apparatus is manufactured.

In an embodiment, the low-reflective layer 400 may include a metal oxide having a high light absorption rate. The low-reflective layer 400 may include a metal oxide having a high light absorption rate, that is, a high extinction coefficient k. In an embodiment, the low-reflective layer 400 may include at least one of copper oxide (CuO), calcium oxide (CaO), molybdenum oxide ($MoO_x$), or zinc oxide (ZnO). In an embodiment, the low-reflective layer 400 may include a material in which copper oxide (CuO) and calcium oxide (CaO) are mixed.

The low-reflective layer 400 may have preset reflective index and thickness such that light reflected by the surface of the low-reflective layer 400 among incident light not absorbed by the low-reflective layer 400, and light reflected on an interface between the low-reflective layer 400 and the second metal layer 320 destructively interfere with each other.

Referring to FIG. 3D, a photoresist PR is formed on the low-reflective layer 400. The photoresist PR may include an opening overlapping the sub-pixel electrode 210 and the protective layer 113. A portion of the upper surface of the low-reflective layer 400 may be exposed through the opening of the photoresist PR.

Referring to FIG. 3E, a portion of the low-reflective layer 400, a portion of the second metal layer 320, and a portion of the first metal layer 310 may be removed by the photoresist PR as a mask. In an embodiment, a portion of the low-reflective layer 400, a portion of the second metal layer 320, and a portion of the first metal layer 310 may be sequentially removed through the opening of the photoresist PR. A portion of the low-reflective layer 400, a portion of the second metal layer 320, and a portion of the first metal layer 310 may be removed by dry-etching. The protective layer 113 may protect the sub-pixel electrode 210 thereunder during the etching process.

As shown in FIG. 3E, an opening 4000P1 overlapping the sub-pixel electrode 210 and the protective layer 113 and passing through the bottom surface from the upper surface of the low-reflective layer 400 may be defined in the low-reflective layer 400 by the etching process. An opening 3200P1 overlapping the sub-pixel electrode 210 and the protective layer 113 and passing through the bottom surface from the upper surface of the second metal layer 320 may be defined in the second metal layer 320. An opening 3100P1 overlapping the sub-pixel electrode 210 and the protective layer 113 and passing through the bottom surface from the upper surface of the first metal layer 310 may be defined in the first metal layer 310.

Referring to FIG. 3F, an opening OP having an undercut shape may be defined in the metal bank layer 300 by the photoresist PR as a mask.

In an embodiment, a portion of the first metal layer 310 may be further etched by the photoresist PR as a mask, and an opening 3100P2 having a greater width than a width of the opening 3100P1 of the first metal layer 310 formed in the process of FIG. 3E may be defined in the first metal layer 310. In an embodiment, the opening 3100P2 of the first metal layer 310 may have a shape having a reducing width toward the lower portion. In an embodiment, the width of the upper portion of the opening 3100P2 of the first metal layer 310 may be greater than the width of the lower portion of the opening 3100P2. In other words, the lateral surface of the first metal layer 310 facing the opening 3100P2 may include a forward-tapered inclination.

In an embodiment, the opening 3100P2 of the first metal layer 310 may be formed through wet etching. Because the first metal layer 310 and the second metal layer 320 respectively include metals with different etching selectivities, a portion of the first metal layer 310 may be removed during the wet etching process, and the opening 3100P2 of the first metal layer 310 having a greater width than the width of the opening 3200P1 of the second metal layer 320 may be formed. During the etching process of forming the opening 3100P2 of the first metal layer 310, the protective layer 113 may protect the sub-pixel electrode 210 thereunder.

Because the opening 3100P2 of the first metal layer 310 has a greater diameter while overlapping the opening 3200P1 of the second metal layer 320, the second metal layer 320 may include a first tip PT1.

A portion of the second metal layer 320 defining the opening 3200P1 of the second metal layer 320 may protrude toward the opening 3200P1 from a point CP at which the lateral surface of the first metal layer 310 facing the opening 3100P2 of the first metal layer 310 meets the bottom surface of the second metal layer 320 and form an undercut structure. The portion of the second metal layer 320 further protruding toward the opening 3200P1 may correspond to the first tip PT1. The length of the first tip PT1, e.g., a length "a" from the point CP to the edge (the lateral surface of the edge) of the first tip PT1 may be 2 micrometers (μm) or less. In an embodiment, the length of the first tip PT1 of the second metal layer 320 may be about 0.3 μm to about 1 μm, or about 0.3 μm to about 0.7 μm.

An inclination angle θ (e.g., an inclination angle of the lateral surface of the first metal layer 310 with respect to an imaginary line IML parallel to the upper surface of the substrate) of the lateral surface of the first metal layer 310 forward tapered and facing the opening 3100P2 of the first metal layer 310 may be equal to or greater than about 60° and less than about 90°.

Referring to FIG. 3G, a portion of the insulating layer 115 may be removed by the photoresist PR as a mask. A portion of the insulating layer 115 may be removed by dry etching. The width of an opening 1150P1 of the insulating layer 115 may be substantially the same as the width of an opening area of the photoresist PR and/or the upper width (e.g., the width of the opening 3200P1 of the second metal layer 320) of the opening OP of the metal bank layer 300.

In an embodiment, the width of the opening 1150P1 of the insulating layer 115 may be less than the lower width of the opening 3100P2 of the first metal layer 310. The lower portion (e.g., a point at which the lateral surface of the first metal layer 310 meets the bottom surface of the first metal layer 310) of the lateral surface of the first metal layer 310 may meet the upper surface of the insulating layer 115.

Referring to FIG. 3H, a portion of the protective layer 113 may be removed by the photoresist PR as a mask. A portion of the protective layer 113 may be removed by wet etching, and the sub-pixel electrode 210 may be exposed through an opening 1130P1 of the protective layer 113. The width of the opening 1130P1 of the protective layer 113 formed while a portion of the protective layer 113 is removed may be greater than the width of the opening 1150P1 of the insulating layer 115. In other words, the edge (or the laterals surface) of the protective layer 113 defining the opening 1130P1 of the protective layer 113 may be disposed under the insulating layer 115.

Then, the photoresist PR is removed.

Referring to FIG. 3I, an intermediate layer 220 and an opposite electrode 230 are formed on the structure of FIG. 3H in which the photoresist PR is removed, to overlap the sub-pixel electrode 210. A stack structure of the sub-pixel electrode 210, the intermediate layer 220, and the opposite electrode 230 corresponds to the light-emitting diode ED. In an embodiment, the intermediate layer 220 and the opposite electrode 230 may each be formed by a deposition method such as a thermal deposition method.

As shown in FIG. 3K, the intermediate layer 220 may include an emission layer 222. The intermediate layer 220 may include a common layer disposed between the sub-pixel electrode 210 and the emission layer 222 and/or between the emission layer 222 and the opposite electrode 230. Hereinafter, a common layer between the sub-pixel electrode 210 and the emission layer 222 is also referred to as a first common layer 221, and a common layer between the emission layer 222 and the opposite electrode 230 is also referred to as a second common layer 223.

The emission layer 222 may include a polymer organic material or a low-molecular weight organic material emitting light having a preset color (red, green, or blue). In another embodiment, the emission layer 222 may include an inorganic material or quantum dots.

The first common layer 221 may include a hole transport layer ("HTL") and/or a hole injection layer ("HIL"). The second common layer 223 may include an electron transport layer ("ETL") and/or an electron injection layer ("EIL"). The first common layer 221 and the second common layer 223 may each include an organic material.

The intermediate layer 220 may have a single stack structure including a single emission layer, or a tandem structure, which is a multi-stack structure including a plurality of emission layers. In the case where the intermediate layer 220 has a tandem structure, a charge generation layer may be disposed between the plurality of stacks.

The opposite electrode 230 may include a conductive material having a low work function. In an embodiment, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloys thereof. In an alternative embodiment, the opposite electrode 230 may further include a layer on the (semi) transparent layer, the layer including ITO, IZO, ZnO, or $In_2O_3$.

Referring to FIG. 3I, the intermediate layer 220 may overlap and contact the sub-pixel electrode 210 through the opening OP of the metal bank layer 300, the opening 1150P1 of the insulating layer 115, and the opening 1130P1 of the protective layer 113. The width of the emission area of the light-emitting diode ED may be substantially the same as the width of the opening 1150P1 of the insulating layer 115.

Because the intermediate layer 220 and the opposite electrode 230 are deposited without a separate mask, a deposition material for forming the intermediate layer 220 and a deposition material for forming the opposite electrode 230 may respectively form a dummy intermediate layer 220b and a dummy opposite electrode 230b on the low-reflective layer 400. The intermediate layer 220 may be separated and apart from the dummy intermediate layer 220b. The opposite electrode 230 may be separated and apart from the dummy opposite electrode 230b. The intermediate layer 220 and the dummy intermediate layer 220b may include the same material and/or the same number of sub-layers (e.g., the first common layer, the emission layer, and the second common layer). The opposite electrode 230 may include the same material as a material of the dummy opposite electrode 230b.

An outer portion including the edge of the opposite electrode 230 may extend beyond the edge of the intermediate layer 220 and directly contact the lateral surface of the first metal layer 310. The first metal layer 310 may be electrically connected to the opposite electrode 230.

Referring to FIG. 3J, an encapsulation layer 500 may be formed on the light-emitting diode ED. The encapsulation layer 500 may include at least one inorganic encapsulation layer and at least one organic encapsulation layer. In an embodiment, it is shown in FIG. 3J that the encapsulation layer 500 includes a first inorganic encapsulation layer 510, an organic encapsulation layer 520 on the first inorganic encapsulation layer 510, and a second inorganic encapsulation layer 530 on the organic encapsulation layer 520.

The first inorganic encapsulation layer 510 and the second inorganic encapsulation layer 530 may include at least one inorganic material selected from among aluminum oxide, titanium oxide, tantalum oxide, hafnium oxide, zinc oxide, silicon oxide, silicon nitride, and silicon oxynitride and be deposited by chemical vapor deposition. The first and second inorganic encapsulation layers 510 and 530 may include a single layer or a multi-layer including the above materials. The organic encapsulation layer 520 may include a polymer-based material. The polymer-based material may include an acryl-based resin, an epoxy-based resin, polyimide, polyethylene, and the like. In an embodiment, the organic encapsulation layer 520 may include acrylate.

The first inorganic encapsulation layer 510 having a relatively excellent step coverage may cover at least a portion of the inner surface of the opening OP of the metal bank layer 300 having the undercut structure. In an embodiment, the first inorganic encapsulation layer 510 may be formed to continuously overlap (or cover) the upper surface and the lateral surface of the dummy opposite electrode 230b, the lateral surface of the dummy intermediate layer 220b, the lateral surface of the low-reflective layer 400, the lateral surface and the bottom surface of the second metal layer 320, the lateral surface of the first metal layer 310, and the upper surface of the opposite electrode 230.

The organic encapsulation layer 520 may be disposed on the first inorganic encapsulation layer 510 and may fill at least a portion of the opening OP of the metal bank layer 300. The second inorganic encapsulation layer 530 may be disposed on the organic encapsulation layer 520.

Figure 4:
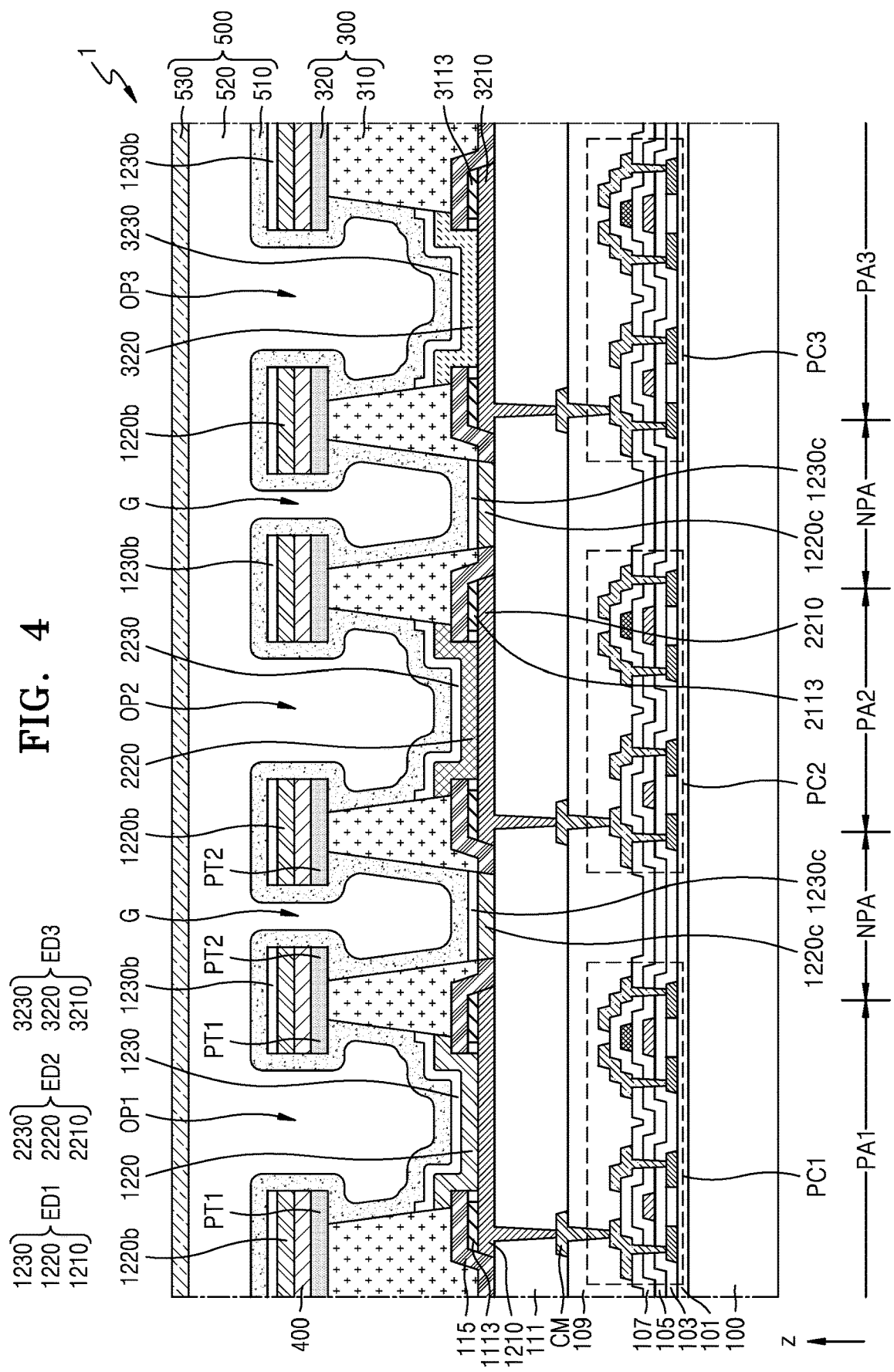
FIG. 4 is a schematic cross-sectional view of an embodiment of a display apparatus.
Figure 5:
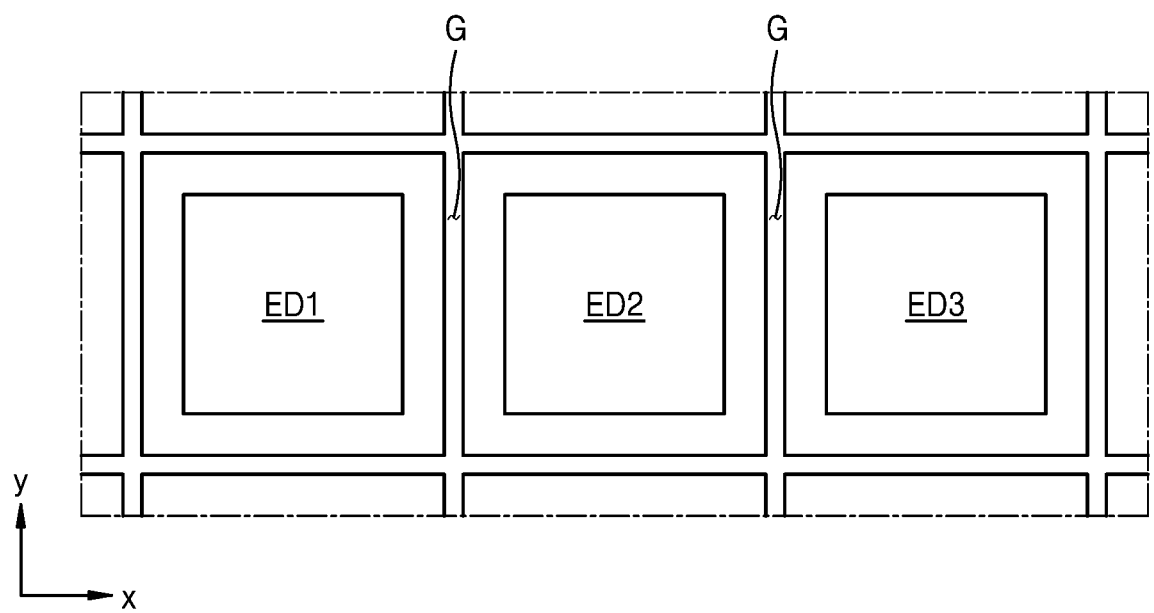
FIG. 5 is a schematic plan view of an embodiment of a groove of a display apparatus.

FIG. 4 is a schematic cross-sectional view of an embodiment of the display apparatus 1, and FIG. 5 is a schematic plan view of a groove of the display apparatus 1.

Referring to FIG. 4, the display apparatus 1 may include first to third sub-pixel areas PA1, PA2, and PA3, and non-sub-pixel areas NPA between adjacent sub-pixel areas. A planar shape of the display apparatus 1 may be actually the same as the planar shape of the substrate 100. Accordingly, when the display apparatus 1 includes the first to third sub-pixel areas PA1, PA2, and PA3, and the non-sub-pixel areas NPA, it may mean that the substrate 100 includes the first to third sub-pixel areas PA1, PA2, and PA3, and the non-sub-pixel areas NPA.

First to third light-emitting diodes ED1, ED2, and ED3 may be disposed over the substrate 100. The first to third light-emitting diodes ED1, ED2, and ED3 may be respectively arranged in first to third sub-pixel areas PA1, PA2, and PA3.

First to third sub-pixel circuits PC1, PC2, and PC3 may be disposed between the substrate 100 and the first to third light-emitting diodes ED1, ED2, and ED3. The first to third sub-pixel circuits PC1, PC2, and PC3 may each include the transistor and the storage capacitor described above with reference to FIG. 2A or 2B. In an embodiment, it is shown in FIG. 4 that the first to third sub-pixel circuits PC1, PC2, and PC3 each have the same structure as the structure of the sub-pixel circuit PC (refer to FIG. 3A) described with reference to FIG. 3A, and a predetermined structure is the same as that described above.

The first to third light-emitting diodes ED1, ED2, and ED3 respectively electrically connected to the first to third sub-pixel circuits PC1, PC2, and PC3 may each have a stack structure of the sub-pixel electrode, the intermediate layer, and the opposite electrode.

In an embodiment, the first light-emitting diode ED1 may include a first sub-pixel electrode 1210, a first intermediate layer 1220, and a first opposite electrode 1230. The first sub-pixel electrode 1210 may be electrically connected to the first sub-pixel circuit PC1. The second light-emitting diode ED2 may include a second sub-pixel electrode 2210, a second intermediate layer 2220, and a second opposite electrode 2230. The second sub-pixel electrode 2210 may be electrically connected to the second sub-pixel circuit PC2. The third light-emitting diode ED3 may include a third sub-pixel electrode 3210, a third intermediate layer 3220, and a third opposite electrode 3230. The third sub-pixel electrode 3210 may be electrically connected to the third sub-pixel circuit PC3.

The first intermediate layer 1220, the second intermediate layer 2220, and the third intermediate layer 3220 may each include the emission layer, and the first and/or second common layers described with reference to FIG. 3K, and predetermined structure and material are the same as those described above. Here, the emission layer of the first intermediate layer 1220, the emission layer of the second intermediate layer 2220, and the emission layer of the third intermediate layer 3220 may emit light of different colors.

The first sub-pixel electrode 1210, the second sub-pixel electrode 2210, and the third sub-pixel electrode 3210 may each include an inner portion and an outer portion surrounding the inner portion. In the specification, the "outer portion (or the peripheral portion) of the sub-pixel electrode" represents a "portion of the sub-pixel electrode including the edge of the sub-pixel electrode," and the "inner portion of the sub-pixel electrode" represents another portion of the sub-pixel electrode surrounded by the outer portion (or the peripheral portion).

The first intermediate layer 1220 may overlap and contact the inner portion of the first sub-pixel electrode 1210, and the first opposite electrode 1230 may overlap the first intermediate layer 1220. The insulating layer 115 may be disposed on the outer portion of the first sub-pixel electrode 1210. The insulating layer 115 may overlap the outer portion of the first sub-pixel electrode 1210 and extend on the second organic insulating layer 111 to cover the lateral surface of the first sub-pixel electrode 1210. A first protective layer 1113 may be disposed between the insulating layer 115 and the outer portion of the first sub-pixel electrode 1210. The insulating layer 115 and the first protective layer 1113 each are disposed on the outer portion of the first sub-pixel electrode 1210 and are not on the inner portion of the first sub-pixel electrode 1210. In other words, the insulating layer 115 and the first protective layer 1113 may each include an opening overlapping the inner portion of the first sub-pixel electrode 1210.

Similarly, the second intermediate layer 2220 may overlap and contact the inner portion of the second sub-pixel electrode 2210, and the second opposite electrode 2230 may overlap the second intermediate layer 2220. The outer portion of the second sub-pixel electrode 2210 may overlap the insulating layer 115. The third intermediate layer 3220 may overlap and contact the inner portion of the third sub-pixel electrode 3210, and the third opposite electrode 3230 may overlap the third intermediate layer 3220. The outer portion of the third sub-pixel electrode 3210 may overlap the insulating layer 115. The insulating layer 115 may overlap the outer portion of each of the second sub-pixel electrode 2210 and the third sub-pixel electrode 3210 and extend on the second organic insulating layer 111 to cover the lateral surfaces of the second sub-pixel electrode 2210 and the third sub-pixel electrode 3210. A second protective layer 2113 may be disposed between the insulating layer 115 and the outer portion of the second sub-pixel electrode 2210, and a third protective layer 3113 may be disposed between the insulating layer 115 and the outer portion of the third sub-pixel electrode 3210.

The first to third openings OP1, OP2, and OP3 respectively overlapping the first to third sub-pixel electrodes 1210, 2210, and 3210 may be defined in the metal bank layer 300. The first to third openings OP1, OP2, and OP3 of the metal bank layer 300 in FIG. 4 each have the same structure as the structure of the opening OP (refer to FIG. 3F) described above with reference to FIG. 3F.

In an embodiment, the first to third openings OP1, OP2, and OP3 may each pass through the bottom surface of the metal bank layer 300 from the upper surface of the metal bank layer 300 and have a cross-sectional structure of an undercut shape. The lateral surface of the first metal layer 310 facing a relevant opening among the first to third openings OP1, OP2, and OP3 of the metal bank layer 300 may have a forward-tapered shape and have an inclination angle equal to or greater than about 60° and less than about 90°. The second metal layer 320 of the metal bank layer 300 may include the first tip PT1 extending toward a relevant opening among the first to third openings OP1, OP2, and OP3. The length of the first tip PT1 may be 2 μm or less. In an embodiment, the length of the first tip PT1 may be about 0.3 μm to about 1 μm, or about 0.3 μm to about 0.7 μm.

The first to third opposite electrodes 1230, 2230, and 3230 physically separated may be electrically connected to each other through the metal bank layer 300. In an embodiment, the outer portion of the first opposite electrode 1230 may be electrically connected to (directly contact) the lateral surface (e.g., the lateral surface of the first metal layer 310) of the metal bank layer 300 facing the first opening OP1. The outer portion of the second opposite electrode 2230 may be electrically connected to (directly contact) the lateral surface (e.g., the lateral surface of the first metal layer 310) of the metal bank layer 300 facing the second opening OP2, and the outer portion of the third opposite electrode 3230 may be electrically connected to (directly contact) the lateral surface (e.g., the lateral surface of the first metal layer 310) of the metal bank layer 300 facing the third opening OP3. The first to third opposite electrodes 1230, 2230, and 3230 each directly contacting the metal bank layer 300 may be electrically connected to each other by the medium of the metal bank layer 300.

The low-reflective layer 400 may be disposed on the metal bank layer 300. External light progressing toward the display apparatus 1 may be reflected by the metal bank layer 300 and viewed by users who use the display apparatus 1. In contrast, in an embodiment, because the low-reflective layer 400 is disposed on the metal bank layer 300, the above issue may be prevented or reduced.

The low-reflective layer 400 may include a metal oxide having a high light absorption rate. The low-reflective layer 400 may include a metal oxide having a high light absorption rate, that is, a high extinction coefficient k. In an embodiment, the low-reflective layer 400 may include at least one of copper oxide (CuO), calcium oxide (CaO), molybdenum oxide ($MoO_x$), or zinc oxide (ZnO). In an embodiment, the low-reflective layer 400 may include a material in which copper oxide (CuO) and calcium oxide (CaO) are mixed.

With the structure of the metal bank layer 300 including the first to third openings OP1, OP2, and OP3 each having the undercut structure, the display apparatus 1 in an embodiment may make a deposition without using a separate mask when forming the first to third intermediate layers 1220, 2220, and 3220 and the first to third opposite electrodes 1230, 2230, and 3230. Accordingly, damage to the display apparatus 1 due to the mask may be prevented.

Because the material forming the intermediate layer and the material forming the opposite electrode are deposited without using the mask, the material forming the intermediate layer and the material forming the opposite electrode may be deposited not only inside the relevant opening among the first to third openings OP1, OP2, and OP3 but also on the low-reflective layer 400. At least one dummy intermediate layer and at least one dummy opposite electrode may be disposed on the low-reflective layer 400. The at least one dummy intermediate layer may be separated and apart from the first to third intermediate layers 1220, 2220, and 3220 respectively disposed in the first to third openings OP1, OP2, and OP3. The at least one dummy opposite electrode may be separated and apart from the first to third opposite electrodes 1230, 2230, and 3230 respectively disposed in the first to third openings OP1, OP2, and OP3. In an embodiment, FIG. 4 shows dummy portions 1220b and 1220c corresponding to the first dummy intermediate layer, and dummy electrode portions 1230b and 1230c corresponding to the first dummy opposite electrode.

Because the first dummy intermediate layer includes an organic material, unexpected impurities (e.g., materials or the like used during a process of ashing the photoresist) may move through the first dummy intermediate layer. To prevent the impurities from moving through the first dummy intermediate layer from progressing toward the first to third light-emitting diodes ED1, ED2, and ED3, a groove G may be arranged between adjacent light-emitting diodes, e.g., in the non-sub-pixel area NPA.

The groove G may have a concave shape with respect to the upper surface of the metal bank layer 300. Like the first to third openings OP1, OP2, and OP3, the groove G may have an undercut shape. A portion of the second metal layer 320 of the metal bank layer 300 may include a second tip PT2 protruding toward the groove G. Though it is shown in FIG. 4 that the bottom surface of the groove G is substantially the same as the upper surface of the second organic insulating layer 111, the disclosure is not limited thereto. The bottom surface of the groove G may be disposed opposite the upper surface of the substrate 100 with the upper surface of the second organic insulating layer 111 therebetween in a z direction. In other words, the depth of the groove G may be less than the depth shown in FIG. 4. In an alternative embodiment, the depth of the groove G may be greater than the depth shown in FIG. 4.

Due to the undercut structure and/or the second tip PT2 of the groove G, the first dummy intermediate layer may include a plurality of dummy portions 1220b and 1220c separated from each other in the non-sub-pixel area NPA. A portion (also referred to as a (1-1)st dummy portion 1220b, hereinafter) of the plurality of dummy portions 1220b and 1220c may be disposed on the low-reflective layer 400, and a portion (also referred to as a (1-2)nd dummy portion 1220c, hereinafter) may be disposed inside the groove G. The (1-1)st dummy portion 1220b may be separated and apart from the (1-2)nd dummy portion 1220c. The (1-1)st dummy portions 1220b respectively disposed on two opposite sides of the groove G with the groove G therebetween may be separated and apart from each other. In an embodiment, the (1-1)st dummy portion 1220b and the (1-2)nd dummy portion 1220c may each include the same material as a material of the first intermediate layer 1220 and/or include the same number of sub-layers.

Like the first dummy intermediate layer, due to the undercut structure of the groove G and/or the second tip PT2, the first dummy opposite electrode may include a plurality of dummy electrode portions 1230b and 1230c separated from each other in the non-sub-pixel area NPA. A portion (also referred to as a (1-1)st dummy electrode portion 1230b, hereinafter) of the plurality of dummy electrode portions 1230b and 1230c may be disposed on the low-reflective layer 400, and a portion (also referred to as a (1-2)nd dummy electrode portion 1230c, hereinafter) may be disposed inside the groove G. The (1-1)st dummy electrode portion 1230b may be separated and apart from the (1-2)nd dummy electrode portion 1230c. The (1-1)st dummy electrode portions 1230b respectively disposed on two opposite sides of the groove G with the groove G therebetween may be separated and apart from each other. In an embodiment, the (1-1)st dummy electrode portion 1230b and the (1-2)nd dummy electrode portion 1230c may each include the same material as a material of the first opposite electrode 1230 and/or include the same number of sub-layers.

As shown in FIG. 5, the groove G may be formed to surround an entirety of each of the first to third light-emitting diodes ED1, ED2, and ED3. Referring to FIGS. 4 and 5, an entirety of each of the first to third light-emitting diodes ED1, ED2, and ED3 may be surrounded by the groove G. In other words, an entirety of the first sub-pixel electrode 1210, the first intermediate layer 1220, and the first opposite electrode 1230 of the first light-emitting diode ED1 may be surrounded by the groove G in a plan view. Similarly, an entirety of the second sub-pixel electrode 2210, the second intermediate layer 2220, and the second opposite electrode 2230 of the second light-emitting diode ED2 may be surrounded by the groove G in a plan view. An entirety of the third sub-pixel electrode 3210, the third intermediate layer 3220, and the third opposite electrode 3230 of the third light-emitting diode ED3 may be surrounded by the groove G in a plan view.

As shown in FIG. 5, the groove G may have a net structure connected to each other in a plan view. In another embodiment, the groove G surrounding the first light-emitting diode ED1 and the groove G surrounding the second light-emitting diode ED2 may not be connected to each other and be closed loop shapes separated from each other.

Referring back to FIG. 4, the first to third light-emitting diodes ED1, ED2, and ED3 may be encapsulated by the encapsulation layer 500. In an embodiment, it is shown in FIG. 4 that the encapsulation layer 500 includes the first inorganic encapsulation layer 510, the organic encapsulation layer 520 on the first inorganic encapsulation layer 510, and the second inorganic encapsulation layer 530 on the organic encapsulation layer 520. The materials of the first inorganic encapsulation layer 510, the organic encapsulation layer 520, and the second inorganic encapsulation layer 530 are the same as those described with reference to FIG. 3J.

The first inorganic encapsulation layer 510 may cover a structure and/or a layer under the first inorganic encapsulation layer 510. In an embodiment, the first inorganic encapsulation layer 510 having a relatively excellent step coverage may cover the inner structure and/or the layer of each of the first to third openings OP1, OP2, and OP3, and the groove G. The first inorganic encapsulation layer 510 may overlap (or cover) the upper surface and the lateral surface of the (1-1)st dummy electrode portion 1230b, the lateral surface of the (1-1)st dummy portion 1220b, the lateral surface of the low-reflective layer 400, the lateral surface and the bottom surface of the second metal layer 320 corresponding to the first tip PT1, the lateral surface of the first metal layer 310, and the upper surfaces of the first to third opposite electrodes 1230, 2230, and 3230. Similarly, the first inorganic encapsulation layer 510 may overlap (or cover) the upper surface and the lateral surface of the (1-1)st dummy electrode portion 1230b, the lateral surface of the (1-1)st dummy portion 1220b, the lateral surface of the low-reflective layer 400, the lateral surface and the bottom surface of the second metal layer 320 corresponding to the first tip PT1, the lateral surface of the first metal layer 310 facing the groove G, and the upper surface of the (1-2)nd dummy electrode portion 1230c.

A portion of the organic encapsulation layer 520 may at least partially fill each of the first to third openings OP1, OP2, and OP3.

FIGS. 6A to 6J are cross-sectional views showing an embodiment of a method of manufacturing a display apparatus.

Figure 6A:
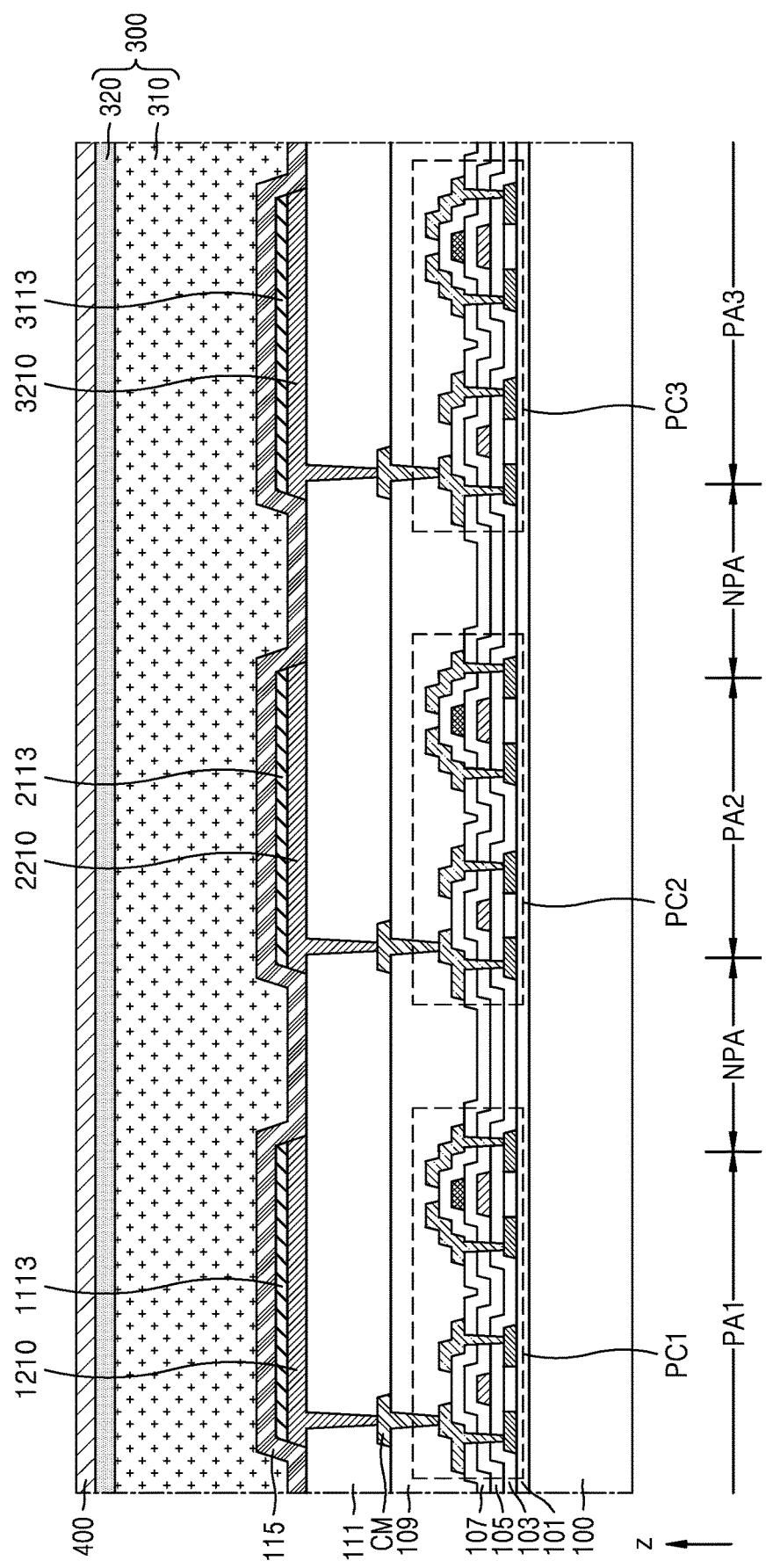
FIGS. 6A to 6J are cross-sectional views showing an embodiment of a method of manufacturing a display apparatus.

Referring to FIG. 6A, the first to third sub-pixel electrodes 1210, 2210, and 3210 are formed over the substrate 100. The first to third sub-pixel electrodes 1210, 2210, and 3210 may be respectively arranged in the first to third sub-pixel areas PA1, PA2, and PA3 and apart from each other.

Before the first to third sub-pixel electrodes 1210, 2210, and 3210 are formed, the first to third sub-pixel circuits PC1, PC2, and PC3, the first organic insulating layer 109, and the second organic insulating layer 111 may be formed between the substrate 100 and the first to third sub-pixel electrodes 1210, 2210, and 3210. In an embodiment, it is shown in FIG. 6A that the first to third sub-pixel circuits PC1, PC2, and PC3 each have the same structure as the structure of the sub-pixel circuit PC described with reference to FIG. 3A.

The substrate 100 may include glass or polymer resin. The buffer layer 101, the first gate insulating layer 103, the first inter-insulating layer 105, and the second inter-insulating layer 107 may be formed on the substrate 100. The buffer layer 101 is formed to prevent impurities from penetrating the semiconductor layer of the transistor, the first gate insulating layer 103 is between the semiconductor layer and the gate electrode, the first inter-insulating layer 105 is between the lower electrode and the upper electrode of the storage capacitor, and the second inter-insulating layer 107 insulates the source electrode/drain electrode of the transistor from the gate electrode of the transistor.

The first to third sub-pixel electrodes 1210, 2210, and 3210 may include a reflective layer and a transparent conductive layer. The reflective layer includes Ag, Mg, Al, Pt, Pd, Au, Ni, Nd, Ir, Cr, or any combinations thereof, and the transparent conductive layer includes ITO, IZO, ZnO, or In$_2$O$_3$. In an embodiment, the first to third sub-pixel electrodes 1210, 2210, and 3210 may include a structure in which an ITO layer, an Ag layer, and an ITO layer are sequentially stacked.

The first to third protective layers 1113, 2113, and 3113 may be formed to respectively overlap the first to third sub-pixel electrodes 1210, 2210, and 3210. The first to third protective layers 1113, 2113, and 3113 may each include a conductive oxide such as ITO, IZO, IGZO, ITZO, ZnO, AZO, GZO, ZTO, GTO, or FTO. The first to third protective layers 1113, 2113, and 3113 and the first to third sub-pixel electrodes 1210, 2210, and 3210 may be patterned together during the same process.

The metal bank layer 300 including the first metal layer 310 and the second metal layer 320, and the low-reflective layer 400 may be sequentially formed on the first to third protective layers 1113, 2113, and 3113. The characteristics such as the materials and thickness of the first metal layer 310, the second metal layer 320, and the low-reflective layer 400 are the same as those described above with reference to FIG. 3C. In an embodiment, the thickness of the first metal layer 310 may be greater than the thickness of the second metal layer 320.

Figure 6B:
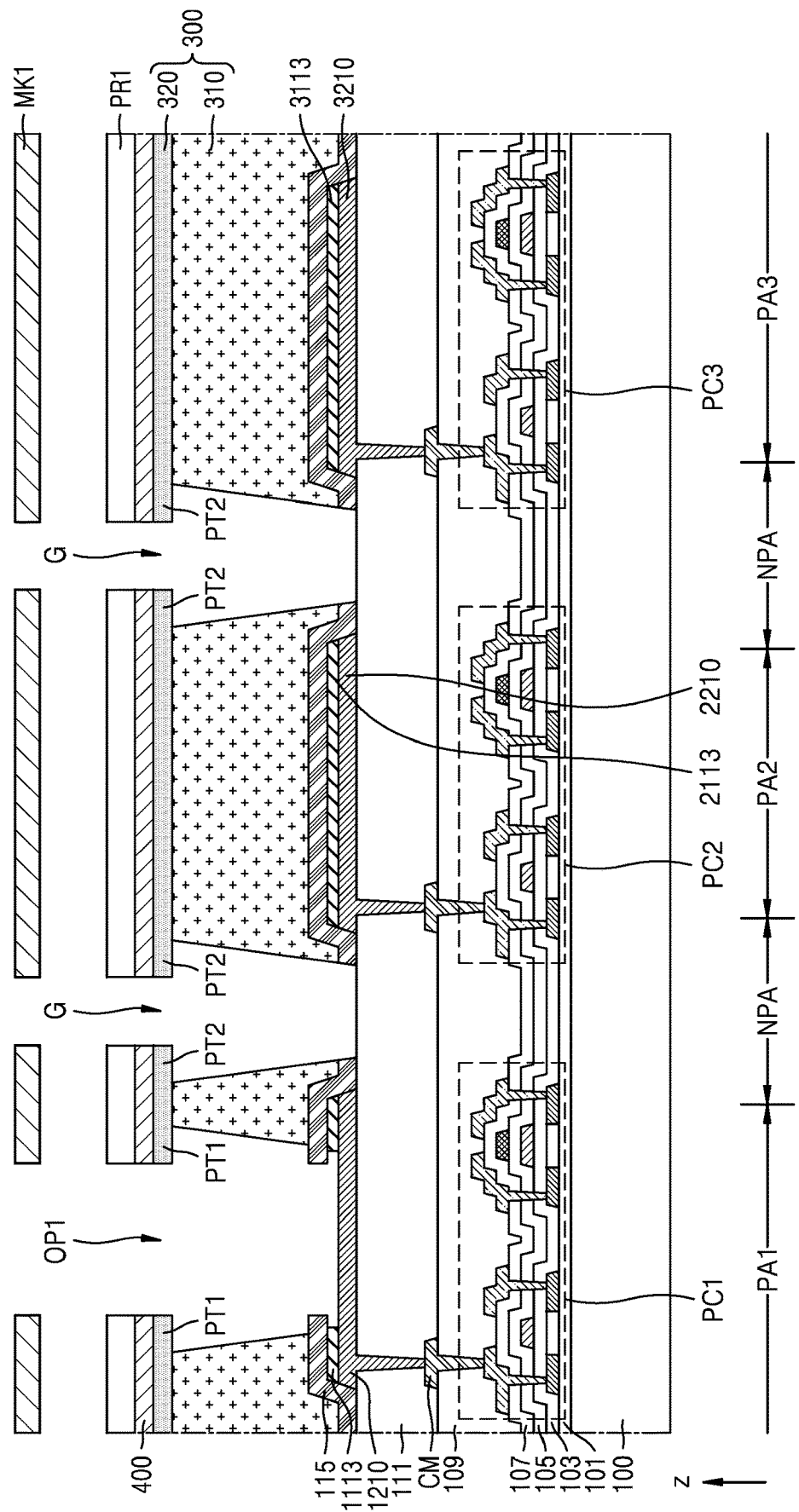

Referring to FIG. 6B, a first photoresist PR1 including opening areas may be formed on the low-reflective layer 400. The openings of the first photoresist PR1 may overlap each of the first sub-pixel area PA1 and the non-sub-pixel area NPA. The first photoresist PR1 may be formed by forming a photosensitive material layer (not shown) on the low-reflective layer 400 and then exposing and developing the photosensitive material layer by a first mask MK1.

Then, the first opening OP1 may be formed by removing a portion of the low-reflective layer 400, a portion of the metal bank layer 300, a portion of the insulating layer 115, and a portion of the first protective layer 1113 disposed in the first sub-pixel area PA1 by the first photoresist PR1 as a mask. A predetermined process of removing a portion of the low-reflective layer 400, a portion of the metal bank layer 300, a portion of the insulating layer 115, and a portion of the first protective layer 1113 and structural characteristics are the same as those described above with reference to FIGS. 3D to 3H. In an embodiment, an inclination angle of the lateral surface of the first metal layer 310 facing the first opening OP1 may be equal to or greater than about 60°, or less than about 90°.

During a process of forming the first opening OP1, the groove G may be defined in the non-sub-pixel area NPA. The groove G and the first opening OP1 may be formed during the same etching process. During the process of forming the first opening OP1, the groove G may be formed by removing a portion of the low-reflective layer 400, a portion of the metal bank layer 300, and a portion of the insulating layer 115 disposed in the non-sub-pixel area NPA by the first photoresist PR1 as a mask.

Because the first photoresist PR1 covers the second and third sub-pixel areas PA2 and PA3, a portion of layers between the second sub-pixel electrode 2210 and the first photoresist PR1, and a portion of layers between the third sub-pixel electrode 3210 and the first photoresist PR1 are not removed.

The first opening OP1 may have a cross-sectional structure of an undercut shape having the first tip PT1, and the groove G may have a cross-sectional structure of an undercut shape having the second tip PT2. Though it is shown in FIG. 6B that the bottom surface of the groove G is substantially the same as the upper surface of the second organic insulating layer 111, the disclosure is not limited thereto. The bottom surface of the groove G may be disposed opposite the upper surface of the substrate 100 with the upper surface of the second organic insulating layer 111 therebetween in a z direction. In other words, the depth of the groove G may be less than the depth shown in FIG. 6B. In an alternative embodiment, the depth of the groove G may be greater than the depth shown in FIG. 6B.

Figure 6C:
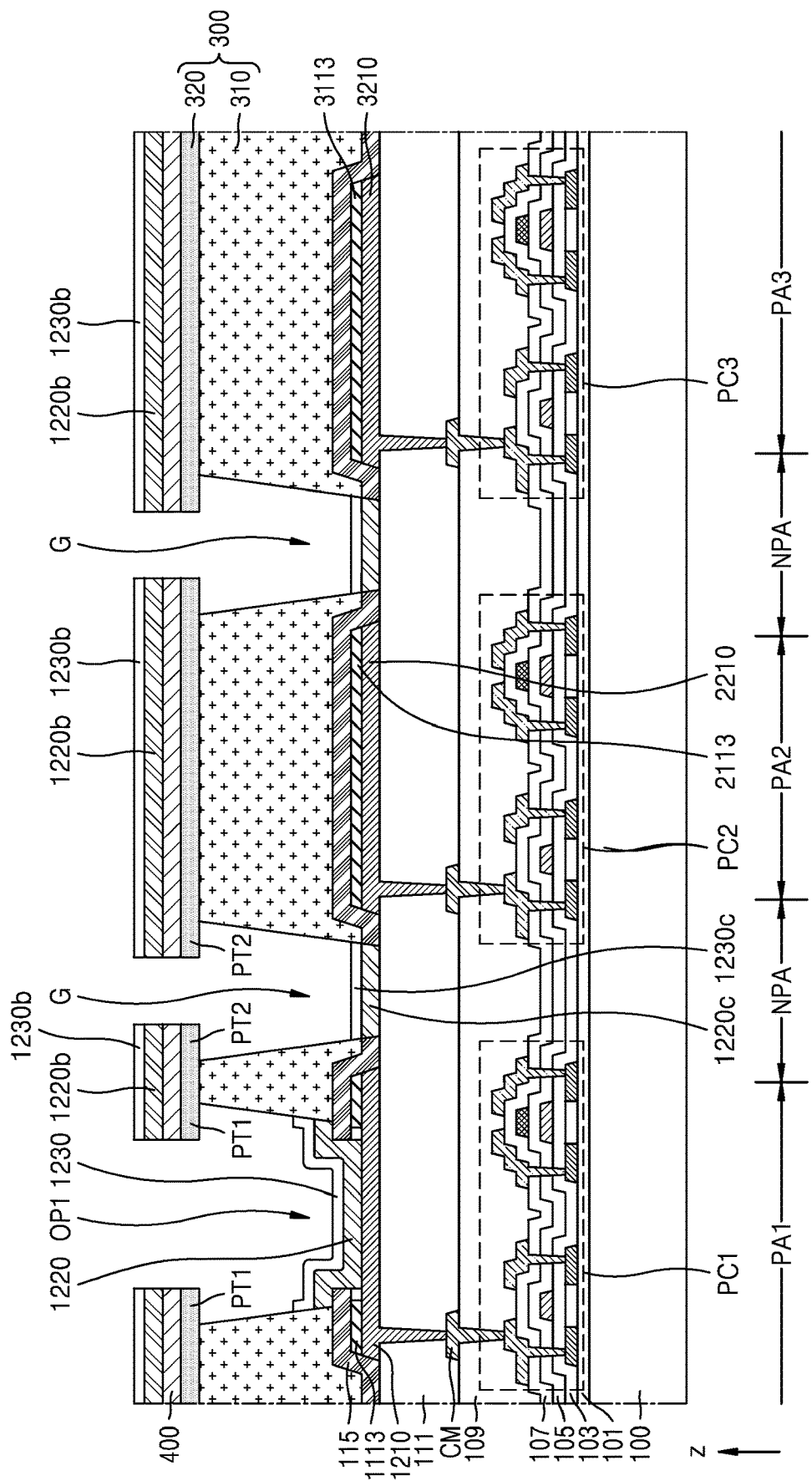

Referring to FIG. 6C, the first photoresist PR1 may be removed, and the first intermediate layer 1220 and the first opposite electrode 1230 may be formed. As described above with reference to FIG. 3K, the first intermediate layer 1220 may have a multi-layered structure including the first common layer, the emission layer, and/or the second common layer. The first intermediate layer 1220 and the first opposite electrode 1230 may each be formed through the deposition method such as a thermal deposition method.

The first intermediate layer 1220 may be formed on the first sub-pixel electrode 1210 through the first opening OP1 of the metal bank layer 300. The inner portion of the first intermediate layer 1220 may directly contact the inner portion of the first sub-pixel electrode 1210, and the outer portion may be disposed on the insulating layer 115.

The first opposite electrode 1230 may overlap the first intermediate layer 1220. During the deposition process, an incident angle of a material forming the first opposite electrode 1230 may be different from an incident angle of a material forming the first intermediate layer 1220. During the process of depositing the first opposite electrode 1230, the outer portion (or the peripheral portion) of the first opposite electrode 1230 may directly contact the lateral surface of the first metal layer 310 facing the first opening OP1. In other words, the edge of the first opposite electrode 1230 may extend to pass beyond the edge of the first intermediate layer 1220 and directly contact the lateral surface of the first metal layer 310.

Because the first intermediate layer 1220 and the first opposite electrode 1230 are deposited without a separate mask, a material for forming the first intermediate layer 1220 and a material for forming the first opposite electrode 1230 may be deposited in not only the first sub-pixel area PA1 but also other areas, e.g., the second and third sub-pixel areas PA2 and PA3, and the non-sub-pixel area NPA.

Due to the structure of the first opening OP1 of the metal bank layer 300 including the first tip PT1, the first intermediate layer 1220 may be separated and apart from the (1-1)st dummy portion 1220b disposed on the low-reflective layer 400, and the first opposite electrode 1230 may be separated and apart from the (1-1)st dummy electrode portion 1230b disposed on the low-reflective layer 400.

Due to the structure of the groove G of the metal bank layer 300 including the second tip PT2, the (1-1)st dummy portion 1220b on the low-reflective layer 400 may be separated and apart from the (1-2)nd dummy portion 1220c formed in the groove G, and the (1-1)st dummy electrode portion 1230b on the low-reflective layer 400 may be separated and apart from the (1-2)nd dummy electrode portion 1230*c* formed in the groove G.

The first intermediate layer 1220, the (1-1)st dummy portion 1220*b*, and the (1-2)nd dummy portion 1220*c* may include the same material and/or the same number of sub-layers (e.g., the first common layer, the emission layer, and the second common layer). The first opposite electrode 1230, the (1-1)st dummy electrode portion 1230*b*, and the (1-2)nd dummy electrode portion 1230*c* may include the same material as each other.

Figure 6D:
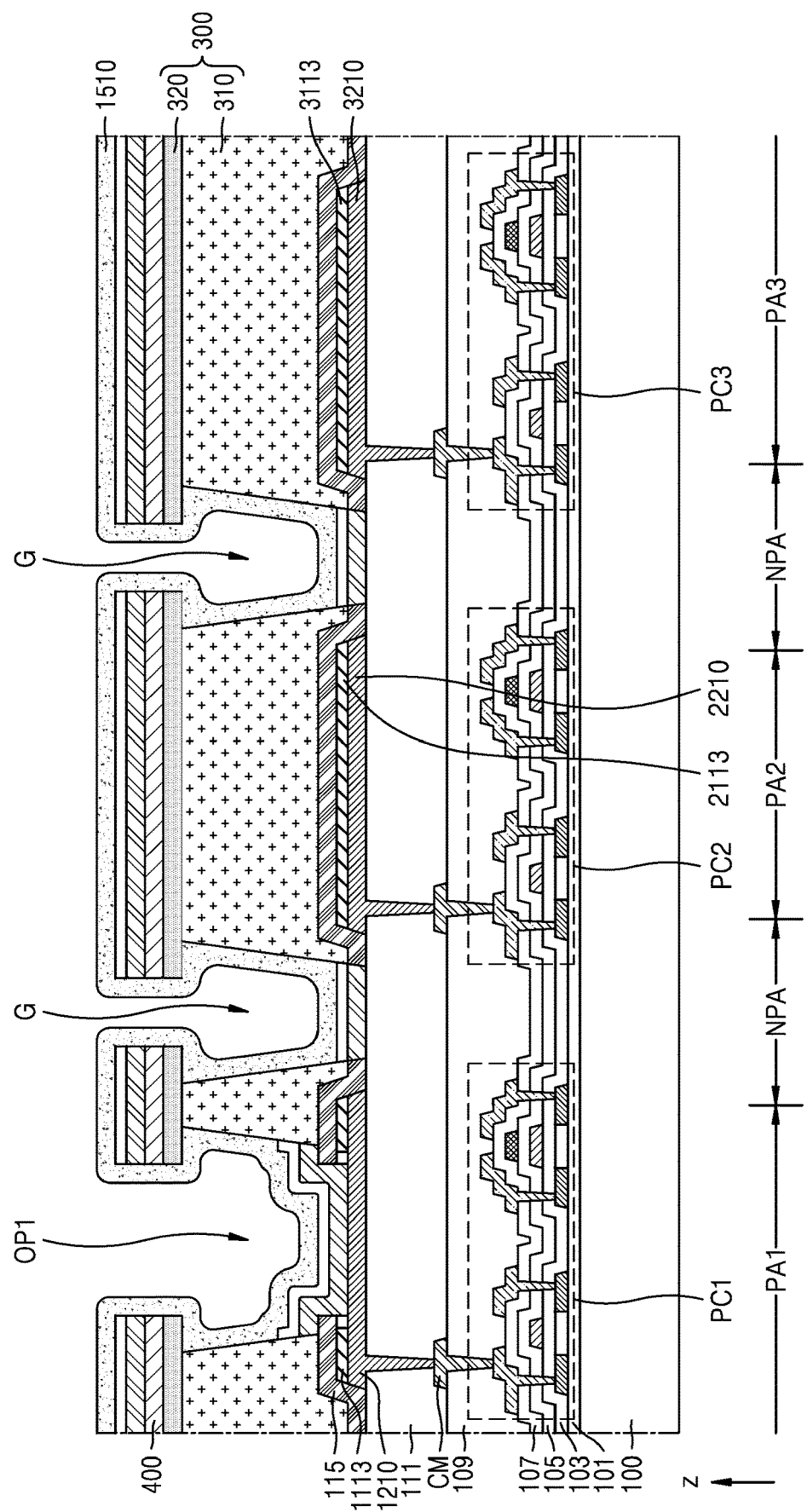

Referring to FIG. 6D, a first inorganic barrier layer 1510 is formed on the structure describe with reference to FIG. 6C. The first inorganic barrier layer 1510 may include at least one inorganic material selected from among aluminum oxide, titanium oxide, tantalum oxide, hafnium oxide, zinc oxide, silicon oxide, silicon nitride, and silicon oxynitride and be deposited by chemical vapor deposition. The first inorganic barrier layer 1510 having an excellent step coverage may continuously cover the structure described with reference to FIG. 6C.

Figure 6E:
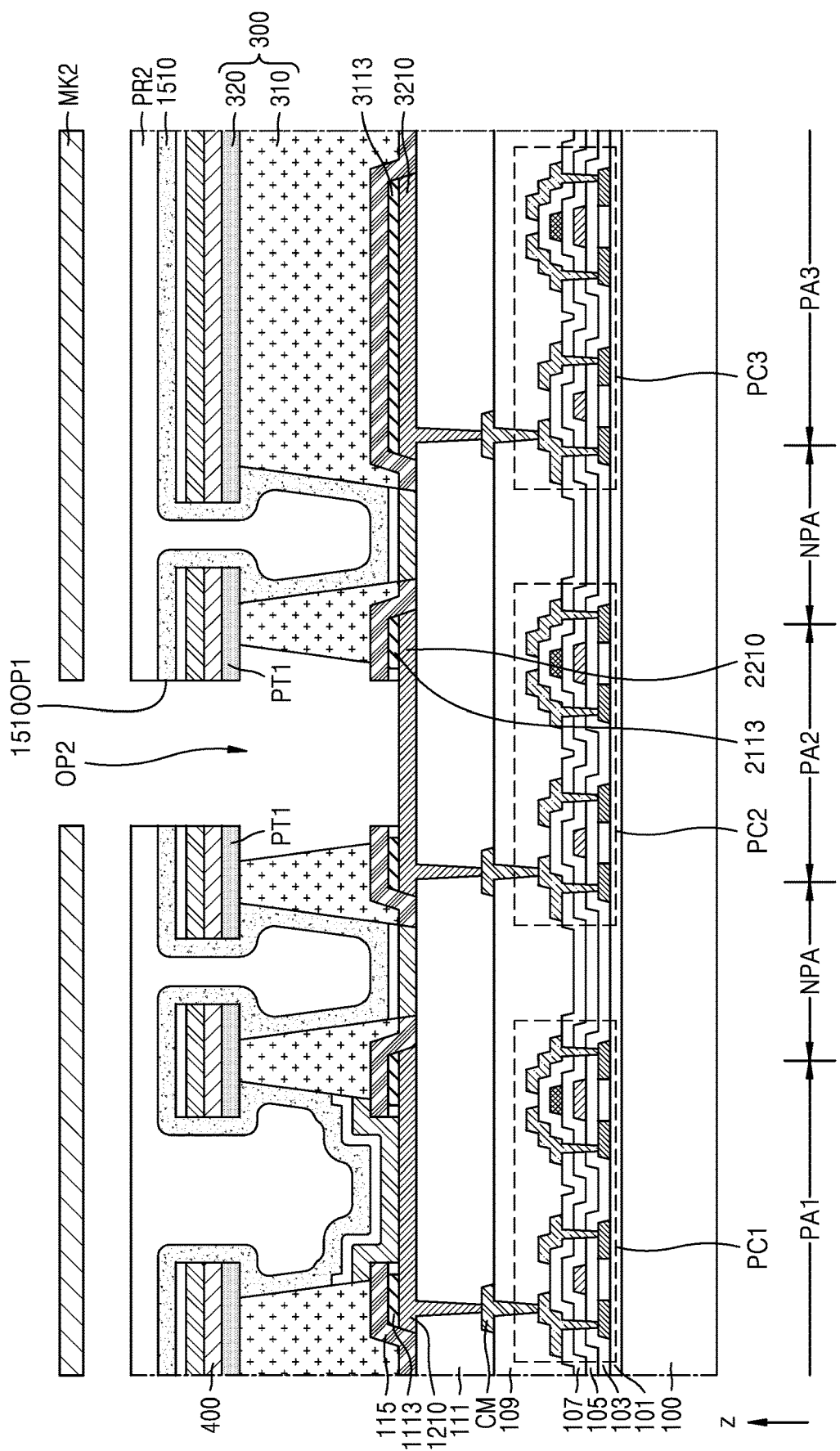

Referring to FIG. 6E, a second photoresist PR2 including an opening area may be formed on the first inorganic barrier layer 1510. An opening of the second photoresist PR2 may overlap the second sub-pixel area PA2. The second photoresist PR2 may be formed by forming a photosensitive material layer (not shown) on the first inorganic barrier layer 1510 and then exposing and developing the photosensitive material layer by a second mask MK2.

Then, the second opening OP2 may be formed by removing a portion of the low-reflective layer 400, a portion of the metal bank layer 300, a portion of the insulating layer 115, and a portion of the second protective layer 2113 disposed in the second sub-pixel area PA2 by the second photoresist PR2 as a mask. A predetermined process of removing a portion of the low-reflective layer 400, a portion of the metal bank layer 300, a portion of the insulating layer 115, and a portion of the second protective layer 2113 and structural characteristics are the same as those described above with reference to FIGS. 3D to 3H. In an embodiment, an inclination angle of the lateral surface of the first metal layer 310 facing the second opening OP2 may be equal to or greater than about 60°, or less than about 90°. Like the first opening OP1, the second opening OP2 may have a cross-sectional structure of an undercut shape having the first tip PT1. In an embodiment, an opening 15100P1 of the first inorganic barrier layer 1510 may also define the second opening OP2.

Figure 6F:
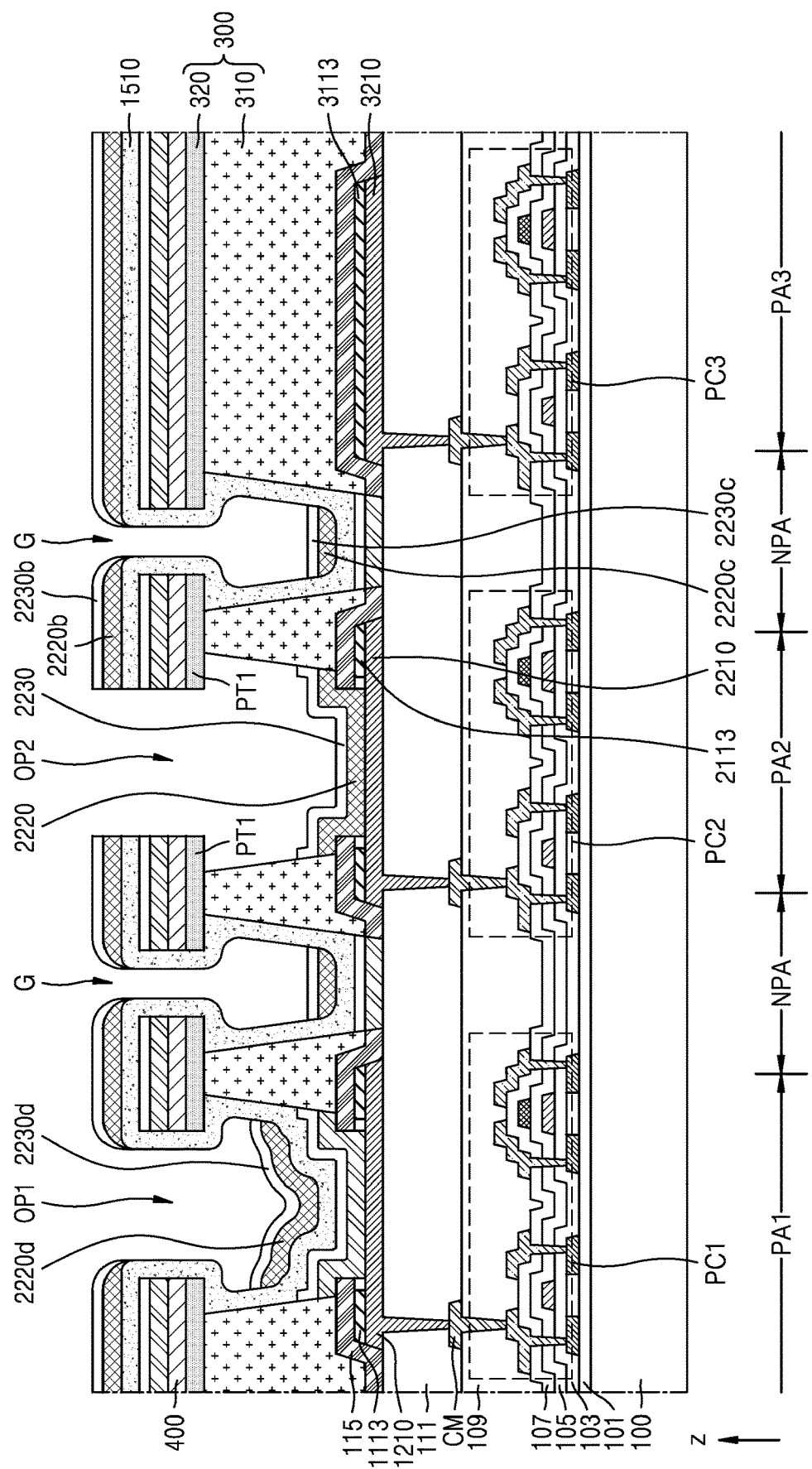

Referring to FIG. 6F, the second photoresist PR2 may be removed, and the second intermediate layer 2220 and the second opposite electrode 2230 may be formed. As described above with reference to FIG. 3K, the second intermediate layer 2220 may have a multi-layered structure including the first common layer, the emission layer, and/or the second common layer. The second intermediate layer 2220 and the second opposite electrode 2230 may each be formed through the deposition method such as a thermal deposition method.

The outer portion (or the peripheral portion) of the second opposite electrode 2230 may be formed to directly contact the lateral surface of the first metal layer 310 facing the second opening OP2. In other words, the edge of the second opposite electrode 2230 may extend to pass beyond the edge of the second intermediate layer 2220 and directly contact the lateral surface of the first metal layer 310.

Because the second intermediate layer 2220 and the second opposite electrode 2230 are deposited without a separate mask, a material for forming the second intermediate layer 2220 and a material for forming the second opposite electrode 2230 may be deposited in not only the second sub-pixel area PA2 but also other areas, e.g., the first and third sub-pixel areas PA1 and PA3, and the non-sub-pixel area NPA.

Due to the structure of the second opening OP2 of the metal bank layer 300 including the first tip PT1, the second intermediate layer 2220 may be separated and apart from the (2-1)st dummy portion 2220*b* disposed on the low-reflective layer 400, and the second opposite electrode 2230 may be separated and apart from the (2-1)st dummy electrode portion 2230*b* disposed on the low-reflective layer 400.

Due to the structure of the groove G of the metal bank layer 300 including the second tip PT2, the (2-1)st dummy portion 2220*b* on the low-reflective layer 400 may be separated and apart from the (2-2)nd dummy portion 2220*c* formed in the groove G, and the (2-1)st dummy electrode portion 2230*b* on the low-reflective layer 400 may be separated and apart from the (2-2)nd dummy electrode portion 2230*c* formed in the groove G.

Due to the structure of the first opening OP1 of the metal bank layer 300 including the first tip PT1, a (2-3)rd dummy portion 2220*d* formed in the first opening OP1 may be separated and apart from the (2-1)st dummy portion 2220*b* on the low-reflective layer 400, and a (2-3)rd dummy electrode portion 2230*d* formed in the first opening OP1 may be separated and apart from the (2-1)st dummy electrode portion 2230*b* on the low-reflective layer 400.

The second intermediate layer 2220, the (2-1)st dummy portion 2220*b*, the (2-2)nd dummy portion 2220*c*, the (2-3)rd dummy portion 2220*d* may include the same material and/or the same number of sub-layers (e.g., the first common layer, the emission layer, and the second common layer). The second opposite electrode 2230, the (2-1)st dummy electrode portion 2230*b*, the (2-2)nd dummy electrode portion 2230*c*, and the (2-3)rd dummy electrode portion 2230*d* may include the same material as each other.

Figure 6G:
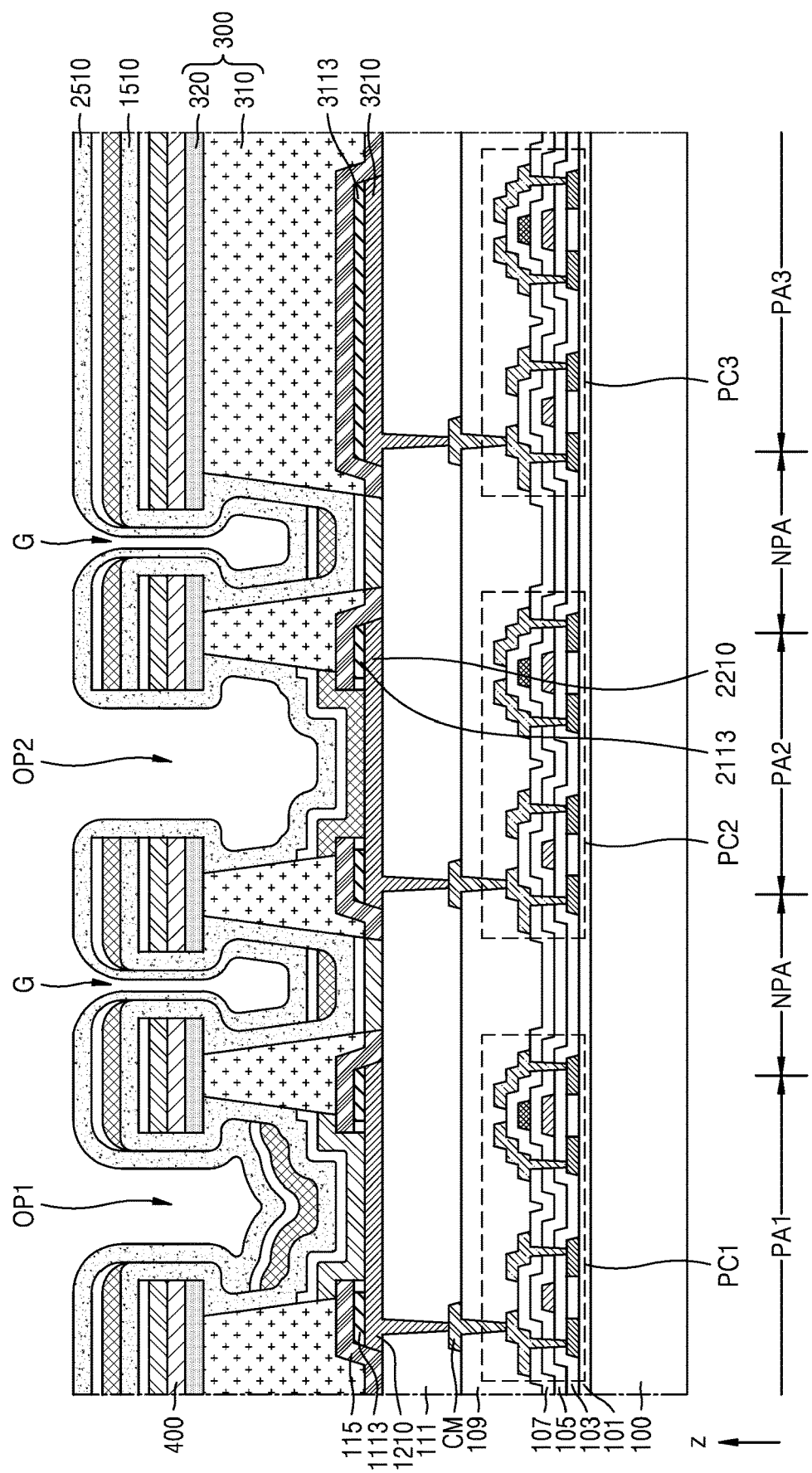

Referring to FIG. 6G, a second inorganic barrier layer 2510 is formed on the structure described with reference to FIG. 6F. The second inorganic barrier layer 2510 may include at least one inorganic material selected from among aluminum oxide, titanium oxide, tantalum oxide, hafnium oxide, zinc oxide, silicon oxide, silicon nitride, and silicon oxynitride and be deposited by chemical vapor deposition. The second inorganic barrier layer 2510 having an excellent step coverage may continuously cover the structure described with reference to FIG. 6F.

Figure 6H:
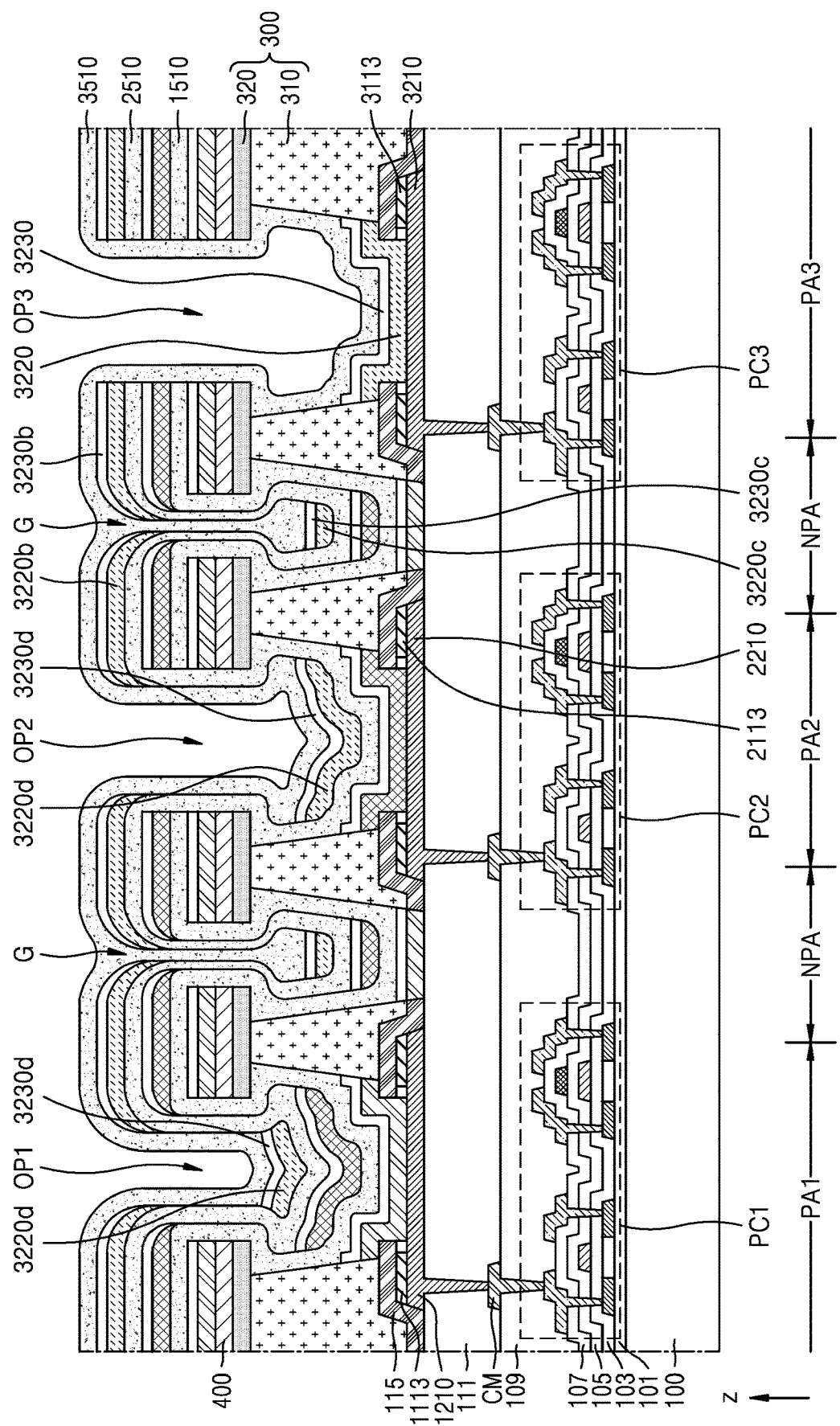

Referring to FIG. 6H, a third photoresist (not shown) including an opening area corresponding to the third sub-pixel area PA3 may be formed, the third opening OP3 may be defined in the metal bank layer 300 by the third photoresist, and the process of forming the third opening OP3 is the same as that described with reference to FIGS. 3D to 3H.

Then, the third photoresist may be removed, and the third intermediate layer 3220 and the third opposite electrode 3230 may be formed. As described above with reference to FIG. 3K, the third intermediate layer 3220 may have a multi-layered structure including the first common layer, the emission layer, and/or the second common layer. The third intermediate layer 3220 and the third opposite electrode 3230 may each be formed through the deposition method such as a thermal deposition method.

The third intermediate layer 3220 may be formed on the third sub-pixel electrode 3210 through the third opening OP3 of the metal bank layer 300. The inner portion of the third intermediate layer 3220 may directly contact the inner portion of the third sub-pixel electrode 3210, and the outer portion may be disposed on the insulating layer 115.

The outer portion (or the peripheral portion) of the third opposite electrode 3230 may directly contact the lateral surface of the first metal layer 310 facing the third opening OP3. In other words, the edge of the third opposite electrode 3230 may extend to pass beyond the edge of the third intermediate layer 3220 and directly contact the lateral surface of the first metal layer 310.

Because the third intermediate layer 3220 and the third opposite electrode 3230 are deposited without a separate mask, a material for forming the third intermediate layer 3220 and a material for forming the third opposite electrode 3230 may be deposited in not only the third sub-pixel area PA3 but also other areas, e.g., the first and second sub-pixel areas PA1 and PA2, and the non-sub-pixel area NPA.

Due to the structure of the third opening OP3 of the metal bank layer 300 including the first tip PT1, the third intermediate layer 3220 may be separated and apart from a (3-1)st dummy portion 3220b disposed on the low-reflective layer 400, and the third opposite electrode 3230 may be separated and apart from the (3-1)st dummy electrode portion 3230b disposed on the low-reflective layer 400.

Due to the structure of the groove G of the metal bank layer 300 including the second tip PT2, the (3-1)st dummy portion 3220b on the low-reflective layer 400 may be separated and apart from a (3-2)nd dummy portion 3220c formed in the groove G, and the (3-1)st dummy electrode portion 3230b on the low-reflective layer 400 may be separated and apart from a (3-2)nd dummy electrode portion 3230c formed in the groove G.

Due to the structures of the first opening OP1 and the second opening OP2 of the metal bank layer 300 including the first tip PT1, (3-3)rd dummy portions 3220d respectively formed in the first opening OP1 and the second opening OP2 may be separated and apart from the (3-1)st dummy portion 3220b on the low-reflective layer 400, and (3-3)rd dummy electrode portions 3230d respectively formed in the first opening OP1 and the second opening OP2 may be separated and apart from the (3-1)st dummy electrode portion 3230b on the low-reflective layer 400.

The third intermediate layer 3220, the (3-1)st dummy portion 3220b, the (3-2)nd dummy portion 3220c, and the (3-3)rd dummy portion 3220d may include the same material and/or the same number of sub-layers (e.g., the first common layer, the emission layer, and the second common layer). The third opposite electrode 3230, the (3-1)st dummy electrode portion 3230b, the (3-2)nd dummy electrode portion 3230c, and the (3-3)rd dummy electrode portion 3230d may include the same material as each other.

Then, a third inorganic barrier layer 3510 may be formed. The third inorganic barrier layer 3510 may include at least one inorganic material selected from among aluminum oxide, titanium oxide, tantalum oxide, hafnium oxide, zinc oxide, silicon oxide, silicon nitride, and silicon oxynitride and be deposited by chemical vapor deposition. The third inorganic barrier layer 3510 having an excellent step coverage may continuously cover a structure under the third inorganic barrier layer 3510.

Figure 6I:
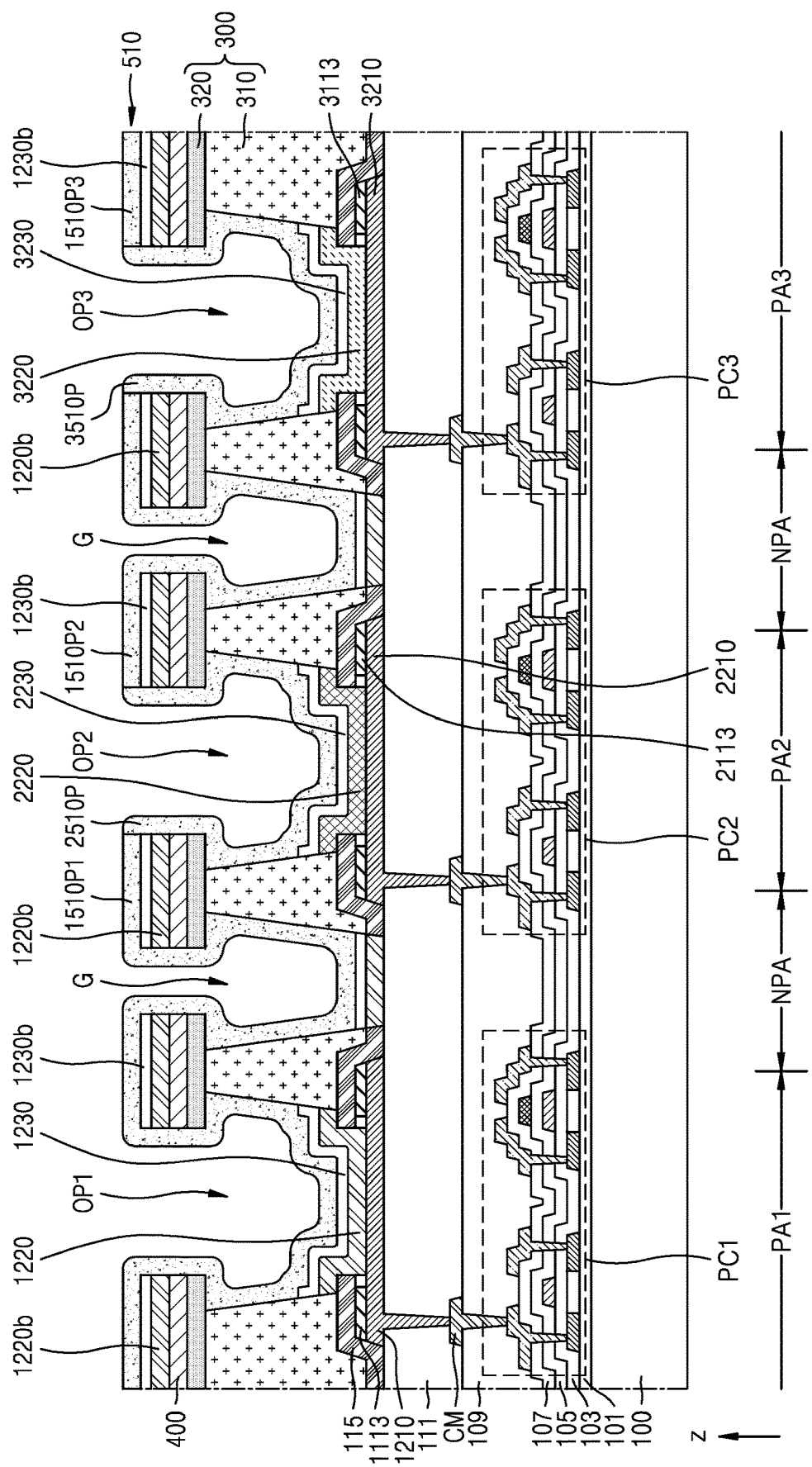

Referring to FIG. 6I, residual intermediate layer(s) and residual opposite electrode(s) arranged in the first sub-pixel area PA1 and the second sub-pixel area PA2 may be removed by etching (e.g., dry-etching). In this case, a portion of each of the first to third inorganic barrier layers may be removed.

A relevant intermediate layer and a relevant opposite electrode may be arranged in each of the first to third sub-pixel areas PA1, PA2, and PA3 through the etching process. In an embodiment, there may be the first intermediate layer 1220 and the first opposite electrode 1230 on the first sub-pixel electrode 1210 in the first sub-pixel area PA1, and there may be the second intermediate layer 2220 and the second opposite electrode 2230 on the second sub-pixel electrode 2210 in the second sub-pixel area PA2. There may be the third intermediate layer 3220 and the third opposite electrode 3230 on the third sub-pixel electrode 3210 in the third sub-pixel area PA3.

The first opposite electrode 1230 may be covered by a first portion 1510P1 of the first inorganic barrier layer, and the second opposite electrode 2230 may be covered by a portion 2510P of the second inorganic barrier layer. The third opposite electrode 3230 may be covered by a portion 3510P of the third inorganic barrier layer.

The first portion 1510P1 of the first inorganic barrier layer may extend to cover the (1-1)st dummy electrode portion 1230b in the non-sub-pixel area NPA, and directly contact a portion 2510P of the second inorganic barrier layer covering the second opposite electrode 2230. In the non-sub-pixel area NPA, a second portion 1510P2 of the first inorganic barrier layer covering the (1-1)st dummy electrode portion 1230b may contact each of the portion 2510P of the second inorganic barrier layer and the portion 3510P of the third inorganic barrier layer. In the non-sub-pixel area NPA, a third portion 1510P3 of the first inorganic barrier layer covering the (1-1)st dummy electrode portion 1230b may contact the portion 3510P of the third inorganic barrier layer covering the third opposite electrode 3230.

The portions of the first to third inorganic barrier layers contacting each other may constitute the first inorganic encapsulation layer 510. In another embodiment, an additional inorganic barrier layer may be formed on the first inorganic encapsulation layer 510 shown in FIG. 6I. Unlike the first inorganic encapsulation layer 510 formed by the portions of the first to third inorganic barrier layers contacting each other, the additional inorganic barrier layer may be continuously formed.

Figure 6J:
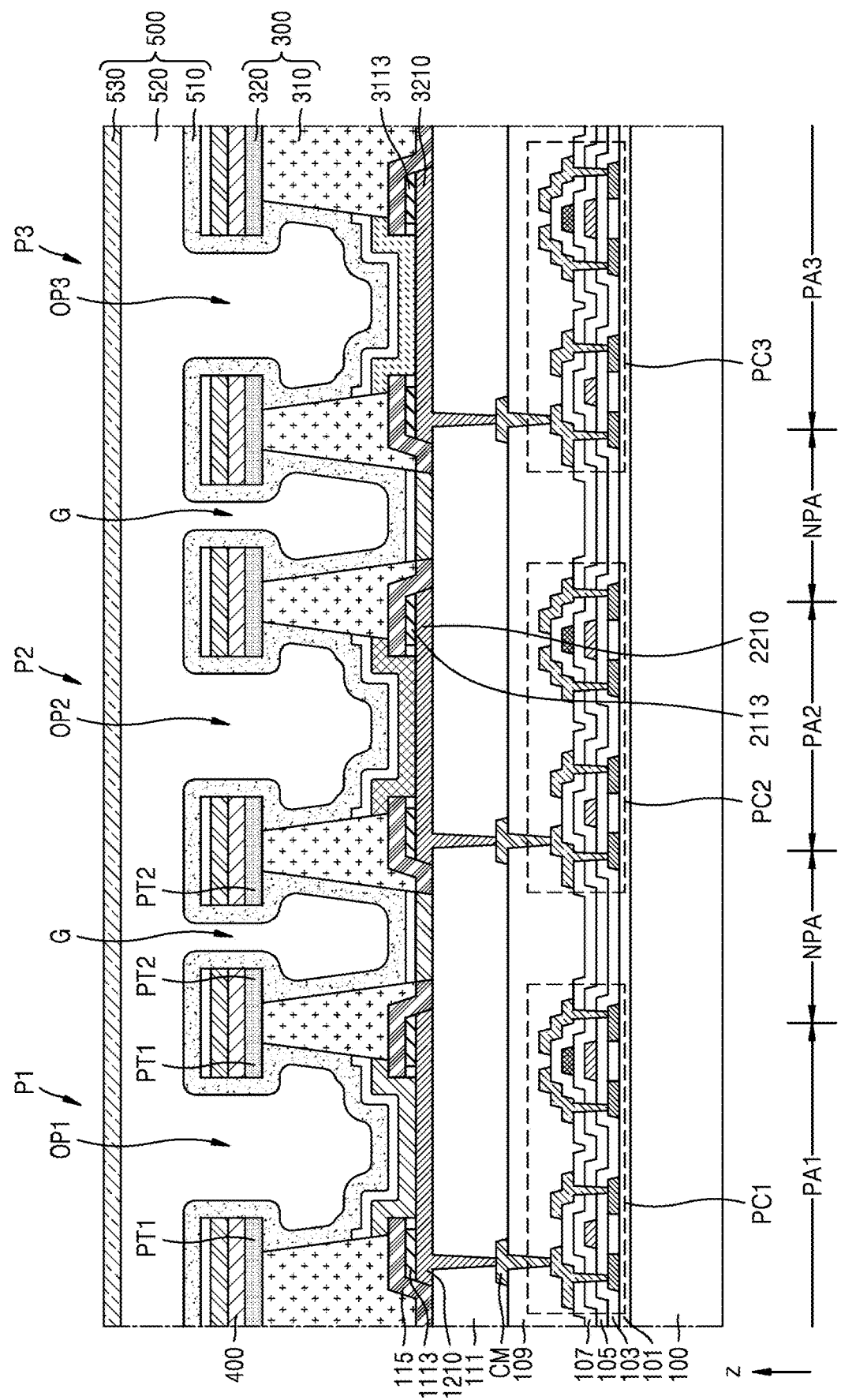

Referring to FIG. 6J, the organic encapsulation layer 520 and the second inorganic encapsulation layer 530 may be formed on the first inorganic encapsulation layer 510.

The organic encapsulation layer 520 may be formed by coating monomer and curing the same. In an embodiment, a portion of the organic encapsulation layer 520 may at least partially fill the first to third openings OP1, OP2, and OP3, and the groove G.

The second inorganic encapsulation layer 530 may include at least one inorganic material selected from among aluminum oxide, titanium oxide, tantalum oxide, hafnium oxide, zinc oxide, silicon oxide, silicon nitride, and silicon oxynitride and be deposited by chemical vapor deposition.

In an embodiment, because the intermediate layer and the opposite electrode of the light-emitting diode may be formed without using a mask, damage to the elements included in the display apparatus may be prevented. In addition, external light may be prevented from being reflected by the metal bank layer and viewed to users by the low-reflective layer. However, this effect is an example, and the disclosure is not limited by this effect.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
a first sub-pixel electrode;
a metal bank layer in which a first opening overlapping the first sub-pixel electrode is defined, the metal bank layer including:
a first metal layer; and
a second metal layer on the first metal layer;
an insulating layer between an outer portion of the first sub-pixel electrode and the metal bank layer;
a first intermediate layer overlapping the first sub-pixel electrode through the first opening of the metal bank layer;
a first opposite electrode disposed on the first intermediate layer through the first opening of the metal bank layer; and
a low-reflective layer disposed on the second metal layer of the metal bank layer and having a reflectivity less than a reflectivity of the second metal layer, wherein the low-reflective layer includes a metal oxide and is disposed between an upper surface of the metal bank layer and a first dummy portion including a same material as a material of the first intermediate layer.

2. The display apparatus of claim 1, wherein the low-reflective layer includes at least one of copper oxide (CuO), calcium oxide (CaO), molybdenum oxide ($MoO_x$), or zinc oxide (ZnO).

3. The display apparatus of claim 1, wherein a portion of the second metal layer facing the first opening of the metal bank layer includes a tip extending from a point where a bottom surface of the second metal layer contacts a lateral surface of the first metal layer to the first opening.

4. The display apparatus of claim 3, wherein a length from the point to a lateral surface of the tip is about 0.3 micrometer to about 1 micrometer.

5. The display apparatus of claim 1, further comprising a protective layer disposed between the outer portion of the first sub-pixel electrode and the insulating layer.

6. The display apparatus of claim 5, wherein the protective layer includes a transparent conductive oxide.

7. The display apparatus of claim 1, wherein an outer portion of the first opposite electrode directly contacts a lateral surface of the first metal layer facing the first opening of the metal bank layer.

8. The display apparatus of claim 1, further comprising a first dummy electrode portion including a same material as a material of the first opposite electrode and disposed on the first dummy portion.

9. The display apparatus of claim 8, further comprising:
a second sub-pixel electrode adjacent to the first sub-pixel electrode;
a second intermediate layer overlapping the second sub-pixel electrode through a second opening of the metal bank layer; and
a second opposite electrode overlapping the second intermediate layer through the second opening of the metal bank layer.

10. The display apparatus of claim 9, wherein a groove is defined in the metal bank layer between the first sub-pixel electrode and the second sub-pixel electrode, and
the groove is concave with respect to an upper surface of the metal bank layer.

11. The display apparatus of claim 10, wherein the first dummy portion is provided in plural so that a plurality of first dummy portions is separated from each other with the groove therebetween.

12. A method of manufacturing a display apparatus, the method comprising:
forming a first sub-pixel electrode;
forming an insulating layer overlapping an outer portion of the first sub-pixel electrode;
forming a metal bank layer in which a first opening overlapping the first sub-pixel electrode is defined, the metal bank layer including:
a first metal layer; and
a second metal layer on the first metal layer;
forming a first intermediate layer overlapping the first sub-pixel electrode through the first opening of the metal bank layer;
forming a first opposite electrode disposed on the first intermediate layer through the first opening of the metal bank layer; and
forming a low-reflective layer disposed on the second metal layer of the metal bank layer and having a reflectivity less than a reflectivity of the second metal layer,
wherein the low-reflective layer includes a metal oxide and is disposed between an upper surface of the metal bank layer and a first dummy portion including a same material as a material of the first intermediate layer.

13. The method of claim 12, wherein the low-reflective layer includes at least one of copper oxide (CuO), calcium oxide (CaO), molybdenum oxide ($MoO_x$), or zinc oxide (ZnO).

14. The method of claim 12, wherein the forming the metal bank layer includes:
defining an opening in each of the first metal layer and the second metal layer, wherein the opening overlaps the first sub-pixel electrode; and
selectively etching the first metal layer, and
the second metal layer includes a tip extending from a point where a bottom surface of the second metal layer contacts a lateral surface of the first metal layer to the first opening.

15. The method of claim 12, further comprising forming a protective layer disposed between the outer portion of the first sub-pixel electrode and the insulating layer and including a transparent conductive oxide.

16. The method of claim 12, wherein the forming the first opposite electrode includes depositing the first opposite electrode such that an outer portion of the first opposite electrode directly contacts a lateral surface of the first metal layer facing the first opening of the metal bank layer.

17. The method of claim 12, further comprising:
forming a second sub-pixel electrode adjacent to the first sub-pixel electrode; and
defining a groove in the metal bank layer, the groove being between the first sub-pixel electrode and the second sub-pixel electrode.

* * * * *